(12) United States Patent
Parham et al.

(10) Patent No.: US 8,487,300 B2
(45) Date of Patent: Jul. 16, 2013

(54) ORGANIC ELECTROLUMINESCENT DEVICES COMPRISING AZOMETHINE-METAL COMPLEXES

(75) Inventors: Amir Hossain Parham, Frankfurt (DE);
Jonas Kroeber, Frankfurt (DE); Anja Gerhard, Veitshöchheim (DE); Rocco Fortte, Frankfurt (DE)

(73) Assignee: Merck Patent GmbH (DE)

( * ) Notice: Subject to any disclaimer, the term of this patent is extended or adjusted under 35 U.S.C. 154(b) by 327 days.

(21) Appl. No.: 12/742,549

(22) PCT Filed: Oct. 14, 2008

(86) PCT No.: PCT/EP2008/008684
§ 371 (c)(1),
(2), (4) Date: May 12, 2010

(87) PCT Pub. No.: WO2009/062578
PCT Pub. Date: May 22, 2009

(65) Prior Publication Data
US 2010/0244009 A1   Sep. 30, 2010

(30) Foreign Application Priority Data

Nov. 12, 2007  (DE) .................. 10 2007 053 771

(51) Int. Cl.
*H01L 29/08* (2006.01)
*H01L 35/24* (2006.01)
*H01L 51/00* (2006.01)
*H01L 21/00* (2006.01)
*C09K 11/02* (2006.01)

(52) U.S. Cl.
USPC .... 257/40; 257/E51.018; 438/46; 252/301.36

(58) Field of Classification Search
USPC .......................................................... 438/46
See application file for complete search history.

(56) References Cited

U.S. PATENT DOCUMENTS

| | | | |
|---|---|---|---|
| 4,539,507 A | 9/1985 | VanSlyke et al. | |
| 5,151,629 A | 9/1992 | VanSlyke | |
| 5,432,014 A | 7/1995 | Sano et al. | |
| 5,840,217 A | 11/1998 | Lupo et al. | |
| 6,410,166 B1 | 6/2002 | Takahashi et al. | |
| 6,458,909 B1 | 10/2002 | Spreitzer et al. | |
| 7,701,131 B2 | 4/2010 | Gerhard et al. | |
| 2005/0244672 A1 | 11/2005 | Che et al. | |
| 2006/0040139 A1 | 2/2006 | Herron et al. | |
| 2006/0255332 A1 | 11/2006 | Becker et al. | |
| 2007/0034863 A1 | 2/2007 | Fortte et al. | |

FOREIGN PATENT DOCUMENTS

| | | |
|---|---|---|
| CN | 1793281 A | 6/2006 |
| EP | 676461 A2 | 10/1995 |
| EP | 1191612 A2 | 3/2002 |
| EP | 1191613 A2 | 3/2002 |
| EP | 1191614 A2 | 3/2002 |
| WO | WO-98/27136 A1 | 6/1998 |
| WO | WO-00/70655 A2 | 11/2000 |
| WO | WO-01/41512 A1 | 6/2001 |
| WO | WO-02/02714 A2 | 1/2002 |
| WO | WO-02/15645 A1 | 2/2002 |
| WO | WO-2005/003253 A2 | 1/2005 |
| WO | WO-2005/011013 A1 | 2/2005 |
| WO | WO-2005/033244 A1 | 4/2005 |

*Primary Examiner* — Fernando L Toledo
*Assistant Examiner* — Valerie N Newton
(74) *Attorney, Agent, or Firm* — Novak Druce Connolly Bove + Quigg LLP

(57) ABSTRACT

The present invention relates to phosphorescent organic electroluminescent devices which contain as a matrix material of emitting layer, metal complexes of the formula (I)

formula (I)

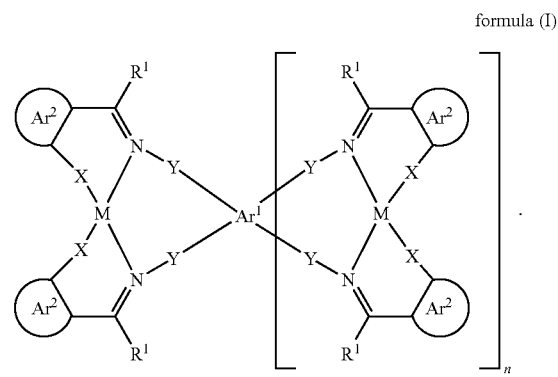

17 Claims, No Drawings

ORGANIC ELECTROLUMINESCENT DEVICES COMPRISING AZOMETHINE-METAL COMPLEXES

CROSS-REFERENCE TO RELATED APPLICATIONS

This application is a national stage application (under 35 U.S.C. §371) of PCT/EP2008/008684, filed Oct. 14, 2008, which claims benefit of German application 10 2007 053 771.0, filed Nov. 12, 2007.

BACKGROUND OF THE INVENTION

The structure of organic electroluminescent devices (OLEDs) in which organic semiconductors are employed as functional materials is described, for example, in U.S. Pat. No. 4,539,507, U.S. Pat. No. 5,151,629, EP 0676461 and WO 98/27136. In recent years, organometallic complexes which exhibit phosphorescence instead of fluorescence are increasingly being employed (M. A. Baldo et al., Appl. Phys. Lett. 1999, 75, 4-6). For quantum-mechanical reasons, an up to four-fold increase in energy and power efficiency is possible using organometallic compounds as phosphorescent emitters. In general, there are still considerable problems in OLEDs which exhibit triplet emission. For example, the physical properties of phosphorescent OLEDs are still unsatisfactory with respect to efficiency, operating voltage and lifetime for use of triplet emitters in high-quality and long-lived electroluminescent devices.

In accordance with the prior art, 4,4'-bis(N-carbazolyl)biphenyl (CBP) is frequently used as matrix material in phosphorescent OLEDs. The disadvantages are short lifetimes of the devices produced therewith and high operating voltages, which result in low power efficiencies. In addition, CBP has an inadequately high glass transition temperature. In spite of all disadvantages of CBP, it continues to be used as triplet matrix material since the problems described above have also not yet been solved satisfactorily using alternative matrix materials.

Aluminium complexes, in particular B-Alq, are furthermore known as triplet matrix materials (for example Chem. Phys. Lett. 2005, 404, 121-125).

US 2006/040139 describes the use of metal complexes with ligands based on Schiff base as host material for photoactive materials. However, only complexes with trivalent metals, in particular aluminium complexes which are penta- or hexacoordinated, are disclosed.

BRIEF SUMMARY OF THE INVENTION

The object of the present invention is the provision of triplet matrix materials which have a sufficiently high glass transition temperature and very good thermal stability and are stable to hydrolysis and result in improvements in the efficiency, lifetime and operating voltage in organic electroluminescent devices compared with the prior art.

Surprisingly, it has now been found that certain metal chelate complexes with divalent metal ions in which the ligand coordinates to the metal via two imine nitrogen atoms exhibit significant improvements, in particular with respect to the lifetime, efficiency, stability to temperature stress, glass transition temperature and hydrolysis stability. These complexes, which may also be in the form of dimers, contain tetracoordinated metal ions in the oxidation state +II in square-planar, tetrahedral or pseudo-tetrahedral coordination. The present invention therefore relates to phosphorescent electroluminescent devices which contain these complexes as matrix material in the emitting layer.

The present invention thus relates to organic electroluminescent devices comprising, in the emitting layer, at least one phosphorescent compound and at least one compound of the formula (I)

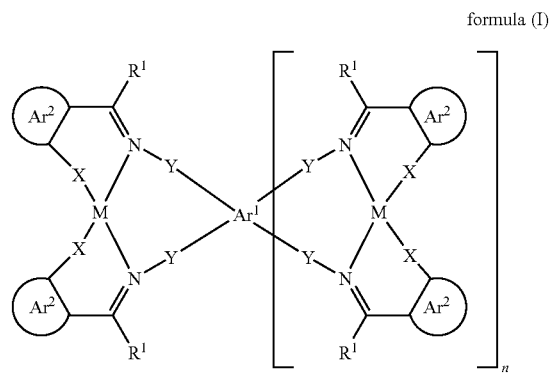

formula (I)

where the following applies to the symbols and indices used:

M is on each occurrence, identically or differently, a metal ion in the oxidation state +II, selected from Be, Mg, Ca, Sr, Ba, Fe, Ru, Os, Co, Ni, Pd, Cu, Zn, Cd, Hg, Sn and Pb;

X is on each occurrence, identically or differently, O, S or CO—O;

$Ar^1$ is an aromatic or heteroaromatic ring system having 5 to 60 aromatic ring atoms, which may be substituted by one or more radicals R and in which individual aromatic groups may be linked to one another via alkylene groups having 1 to 10 C atoms, in which, in addition, one or more non-adjacent C atoms may be replaced by O or S;

$Ar^2$ is on each occurrence, identically or differently, an aromatic or heteroaromatic ring system having 5 to 60 aromatic ring atoms, which may be substituted by one or more radicals R;

Y is on each occurrence, identically or differently, a single bond or an alkylene group having 1 to 10 C atoms, in which, in addition, one or more non-adjacent C atoms which are not bonded to the nitrogen may be replaced by O and which may be substituted by one or more radicals R;

R is on each occurrence, identically or differently, H, F, Cl, Br, I, $N(R^2)_2$, CN, $NO_2$, $Si(R^2)_3$, $B(OR^2)_2$, $C(=O)R^2$, $P(=O)(R^2)_2$, $S(=O)R^2$, $S(=O)_2R^2$, $OSO_2R^2$, a straight-chain alkyl, alkoxy or thioalkyl group having 1 to 40 C atoms or a branched or cyclic alkyl, alkoxy or thioalkyl group having 3 to 40 C atoms, each of which may be substituted by one or more radicals $R^2$, where one or more non-adjacent $CH_2$ groups may be replaced by $R^2C=CR^2$, $C\equiv C$, $Si(R^2)_2$, $Ge(R^2)_2$, $Sn(R^2)_2$, $C=O$, $C=S$, $C=Se$, $C=NR^2$, $P(=O)(R^2)$, SO, $SO_2$, $NR^2$, O, S or $CONR^2$ and where one or more H atoms may be replaced by F, Cl, Br, I, CN or $NO_2$, or an aromatic or heteroaromatic ring system having 5 to 60 aromatic ring atoms, each of which may be substituted by one or more radicals $R^2$, or an aryloxy or heteroaryloxy group having 5 to 60 aromatic ring atoms, which may be substituted by one or more radicals $R^2$, or a combination of these systems; two or more substituents R here may also form a mono- or polycyclic aliphatic or aromatic ring system with one another;

$R^1$ is on each occurrence, identically or differently, H, F, $CF_3$, a straight-chain alkyl group having 1 to 40 C atoms or a branched or cyclic alkyl group having 3 to 40 C atoms, each of which may be substituted by one or more radicals $R^2$, where one or more non-adjacent $CH_2$ groups may be replaced by $R^2C=CR^2$, $C≡C$, $Si(R^2)_2$, $Ge(R^2)_2$, $Sn(R^2)_2$ and where one or more H atoms may be replaced by F, Cl, Br, I, CN or $NO_2$, or an aromatic or heteroaromatic ring system having 5 to 60 aromatic ring atoms, each of which may be substituted by one or more radicals $R^2$, or a combination of these systems; $R^1$ here may also form a mono- or polycyclic aliphatic or aromatic ring system with one or more substituents R;

$R^2$ is on each occurrence, identically or differently, H, F or an aliphatic, aromatic or heteroaromatic hydrocarbon radical having 1 to 20 C atoms, in which, in addition, one or more H atoms may be replaced by F; two or more substituents $R^2$ here may also form a mono- or polycyclic aliphatic or aromatic ring system with one another;

n is on each occurrence, identically or differently, 0, 1 or 2.

DETAILED DESCRIPTION OF THE INVENTION

The compounds of the formula (I) preferably have a glass transition temperature $T_g$ of above 100° C., particularly preferably above 120° C.

For the purposes of the present invention, a phosphorescent compound is taken to mean a compound which luminesces from an excited state with higher spin multiplicity, i.e. a spin state >1, in particular from an excited triplet state. The emission here can take place either from a pure triplet state or from a mixed state with participation of a triplet state. For the purposes of this invention, any luminescence from an iridium or platinum complex is taken to mean phosphorescence.

For the purposes of the present invention, an aryl group contains 6 to 40 C atoms; for the purposes of the present invention, a heteroaryl group contains 2 to 40 C atoms and at least one heteroatom, with the proviso that the sum of C atoms and heteroatoms is at least 5. The heteroatoms are preferably selected from N, O and S. An aryl group or heteroaryl group here is taken to mean either a simple aromatic ring, i.e. benzene, or a simple heteroaromatic ring, for example pyridine, pyrimidine, thiophene, or a condensed aryl or heteroaryl group, for example naphthalene, anthracene, phenanthrene, quinoline, isoquinoline.

For the purposes of the present invention, an aromatic ring system contains 6 to 40 C atoms in the ring system. For the purposes of the present invention, a heteroaromatic ring system contains 2 to 40 C atoms and at least one heteroatom in the ring system, with the proviso that the sum of C atoms and heteroatoms is at least 5. The heteroatoms are preferably selected from N, O and S. For the purposes of this invention, an aromatic or heteroaromatic ring system is to be taken to mean a system which does not necessarily contain only aryl or heteroaryl groups, but instead in which a plurality of aryl or heteroaryl groups may also be interrupted by a non-aromatic unit (preferably less than 10% of the atoms other than H), such as, for example, an $sp^3$-hybridised C, N or O atom. Thus, for example, systems such as 9,9'-spirobifluorene, 9,9-diarylfluorene, triarylamine, diaryl ether, stilbene, are also to be regarded as aromatic ring systems for the purposes of the present invention, and likewise systems in which two or more aryl groups are interrupted, for example, by a linear or cyclic alkyl group or by a silyl group.

For the purposes of the present invention, a $C_1$- to $C_{40}$-alkyl group, in which, in addition, individual H atoms or $CH_2$ groups may be substituted by the above-mentioned groups, is preferably taken to mean the radicals methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl, heptynyl or octynyl. A $C_1$- to $C_{40}$-alkoxy group is preferably taken to mean methoxy, trifluoromethoxy, ethoxy, n-propoxy, i-propoxy, n-butoxy, i-butoxy, s-butoxy, t-butoxy or 2-methylbutoxy. An aromatic or heteroaromatic ring system having 5 to 40 aromatic ring atoms, which may also in each case be substituted by the above-mentioned radicals R and which may be linked to the aromatic or heteroaromatic ring system via any desired positions, is taken to mean, in particular, groups derived from benzene, naphthalene, anthracene, phenanthrene, pyrene, chrysene, benzanthracene, perylene, fluoranthene, benzofluoranthene, naphthacene, pentacene, benzopyrene, dibenzanthracene, biphenyl, biphenylene, terphenyl, terphenylene, fluorene, spirobifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

In a preferred embodiment of the invention, the metal M is selected from Be, Mg, Pd, Zn or Cd. The metal M is particularly preferably Zn.

The index n is furthermore preferably=0 or 1. The index n is particularly preferably 0.

The symbol Y, identically or differently on each occurrence, furthermore preferably stands for a single bond or for a $C(R)_2$ group, particularly preferably for a single bond.

The symbol X, identically or differently on each occurrence, furthermore preferably stands for O or S, particularly preferably for O.

Particular preference is given to compounds of the formula (I) in which the preferences mentioned above are present simultaneously, i.e. compounds in which the metal M is selected from Be, Mg, Pd, Zn or Cd and in which the index n=0 or 1 and in which the symbol Y, identically or differently on each occurrence, stands for a single bond or for a $C(R)_2$ group and in which the symbol X, identically or differently on each occurrence, stands for O or S. Very particular preference is given to compounds of the formula (I) in which the metal M is Zn and in which the index n=0 and in which the symbol Y stands for a single bond and in which the symbol X stands for O.

The symbol Ar¹ furthermore preferably stands, for n=0, for an aromatic or heteroaromatic ring system having 5 to 24 aromatic ring atoms, each of which may be substituted by one or more radicals R. The group Y—Ar¹—Y particularly preferably stands, for n=0, for a group of the following formulae (II) to (XV):

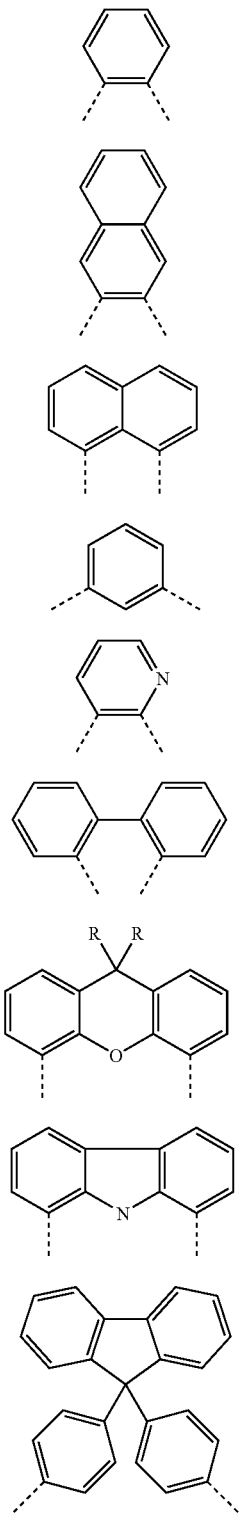

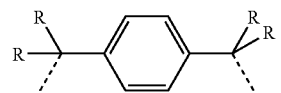

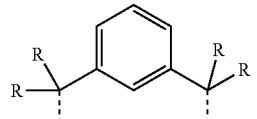

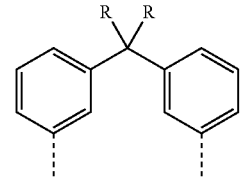

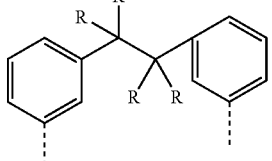

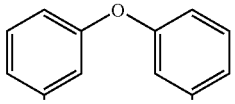

The symbol Ar¹ furthermore preferably stands, for n=1, for an aromatic or heteroaromatic ring system having 5 to 24 aromatic ring atoms, in particular having 6 to 12 aromatic ring atoms, each of which may be substituted by one or more radicals R. The symbol Ar¹ particularly preferably stands, for n=1, for a group of the following formulae (XVI) to (XXI):

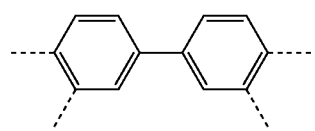

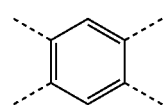

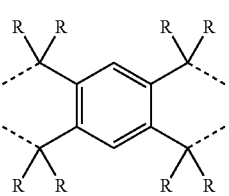

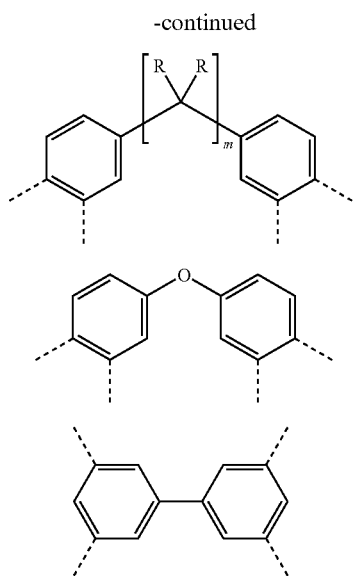

The dashed bonds in the formulae (II) to (XXI) in each case represent the link to the imine nitrogen. The index m in formula (XIX) is 1 to 10.

Particular preference is given to compounds of the formula (I) which simultaneously have the above-mentioned preferences for M, n, Y and X and a group $Ar^1$ selected from the formulae (II) to (XXI) depicted above.

The symbol $Ar^2$, identically or differently on each occurrence, furthermore preferably stands for an aryl or heteroaryl group having 5 to 16 aromatic ring atoms, which may be substituted by one or more radicals R. The symbol $Ar^2$, identically or differently on each occurrence, particularly preferably stands for an aryl or heteroaryl group selected from phenyl, 1- or 2-naphthyl, 4-biphenyl, 1- or 2-anthryl, 2- or 3-thienyl, 2- or 3-pyrrolyl, 2- or 3-furanyl, 2-, 3- or 4-pyridinyl, 3- or 4-pyridazinyl, 4- or 5-pyrimidinyl, pyrazinyl, 2-, 3-, 4-, 5-, 6-, 7- or 8-quinolinyl or 3-, 4-, 5-, 6-, 7- or 8-isoquinolinyl, each of which may be substituted by one or more radicals R. Very particular preference is given to phenyl, 1-naphthyl, 2-naphthyl and 4-biphenyl, in particular phenyl, each of which may be substituted by one or more radicals R.

Particular preference is given to compounds of the formula (I) which simultaneously have the above-mentioned preferred groups $Ar^2$ and a group $Ar^1$ selected from the formulae (II) to (XXI) depicted above. Very particular preference is given to compounds of the formula (I) which simultaneously have the above-mentioned particular preferences for M, n, Y, X and $Ar^2$ and a group $Ar^1$ selected from the formulae (II) to (XV) depicted above.

The symbol R, identically or differently on each occurrence, furthermore preferably stands for H, F, $N(R^2)_2$, $Si(R^2)_3$, $C(=O)R^2$, $P(=O)(R^2)_2$, a straight-chain alkyl group having 1 to 10 C atoms or a branched or cyclic alkyl group having 3 to 10 C atoms, each of which may be substituted by one or more radicals $R^2$, where one or more non-adjacent $CH_2$ groups may be replaced by $R^2C=CR^2$, O or S and one or more H atoms may be replaced by F, or an aryl or heteroaryl group having 5 to 16 aromatic ring atoms, each of which may be substituted by one or more radicals $R^2$, or a combination of these systems; two or more substituents R here may also form a mono- or polycyclic aliphatic or aromatic ring system with one another. The symbol R, identically or differently on each occurrence, particularly preferably stands for H, F, a straight-chain alkyl group having 1 to 4 C atoms or a branched alkyl group having 3 or 4 C atoms, each of which may be substituted by one or more radicals $R^2$, where one or more H atoms may be replaced by F, or an aryl group having 6 to 10 aromatic ring atoms, which may in each case be substituted by one or more radicals $R^2$; two or more substituents R here may also form a mono- or polycyclic aliphatic or aromatic ring system with one another.

The symbol $R^1$, identically or differently on each occurrence, furthermore preferably stands for H, a straight-chain alkyl group having 1 to 6 C atoms or a branched or cyclic alkyl group having 3 to 6 C atoms, where in each case one or more H atoms may also be replaced by F, or for an aryl or heteroaryl group having 5 to 16 aromatic ring atoms, each of which may be substituted by one or more radicals $R^2$. The symbol $R^1$, identically or differently on each occurrence, particularly preferably stands for H, a methyl group or a phenyl or naphthyl group, each of which may be substituted by one or more radicals $R^2$.

The compounds of the formula (I) may optionally be in dimeric or oligomeric form in the solid state and are not necessarily in the form of simple complexes, as depicted in simplified form in formula (I). Organic electroluminescent devices which contain compounds of the formula (I) which are in dimeric or oligomeric form are therefore naturally covered by the invention in the same way as electroluminescent devices which contain the compounds of the formula (I) as simple complexes.

Preference is furthermore given to symmetrical compounds, i.e. compounds in which all symbols $Ar^2$ are identical, all symbols X are identical, all symbols $R^1$ are identical, all symbols Y are identical and which are identically substituted.

Examples of preferred compounds containing structural elements of the formula (I) are compounds (1) to (180) depicted below:

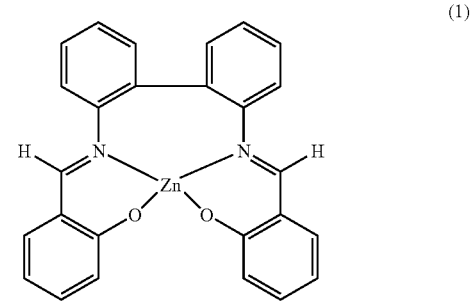

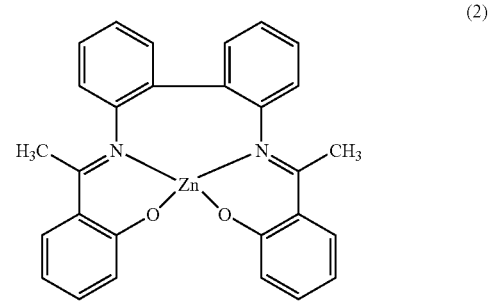

(3)
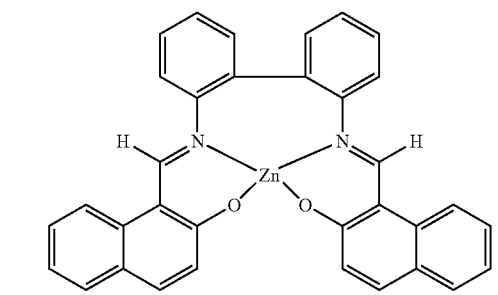
(4)
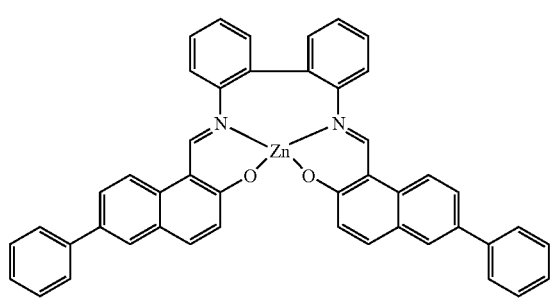
(5)
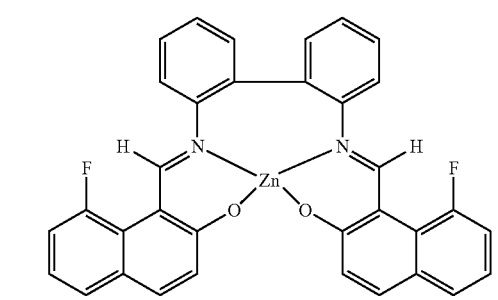
(6)
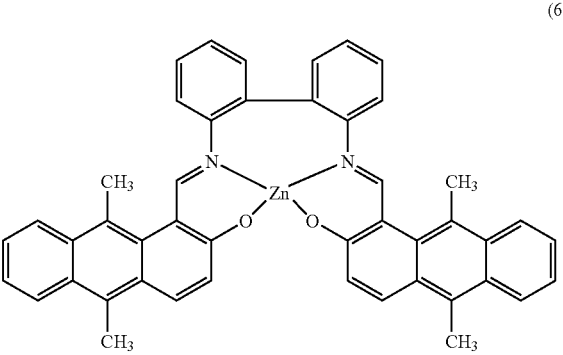
(7)
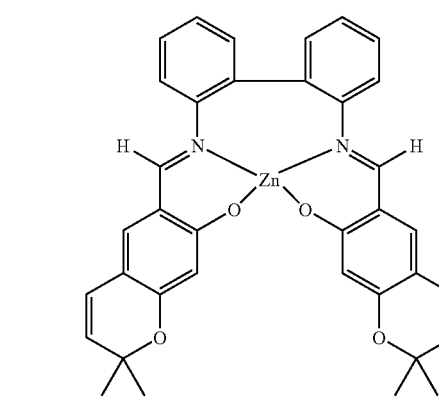
(8)
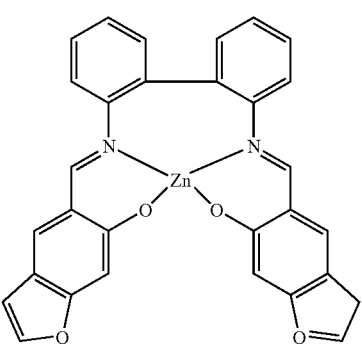
(9)
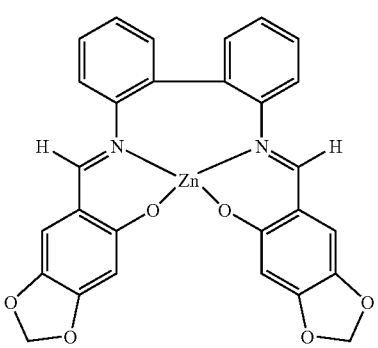
(10)
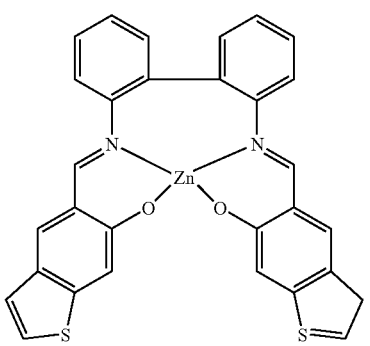
(11)
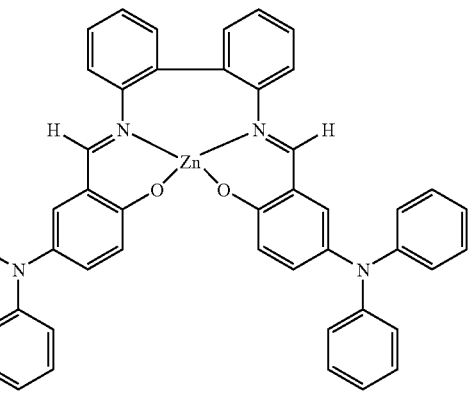

(12)
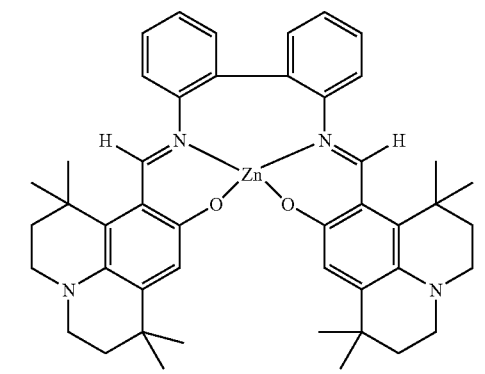
(13)
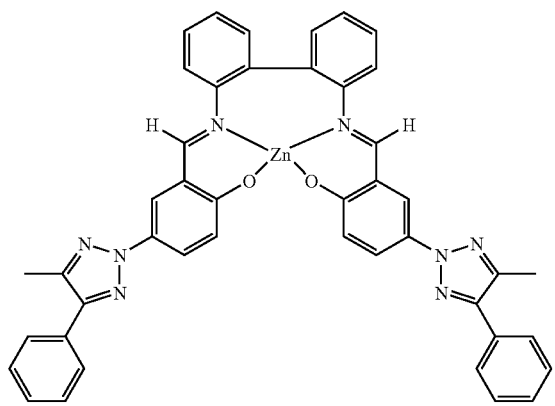
(14)
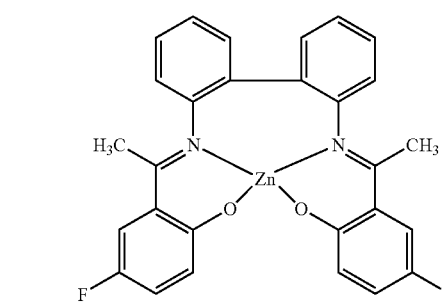
(15)
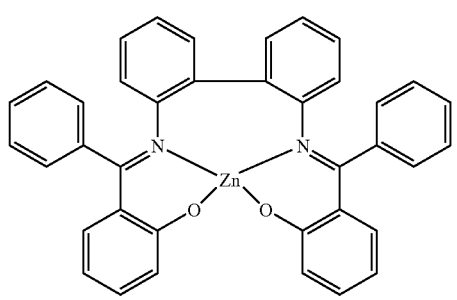
(16)
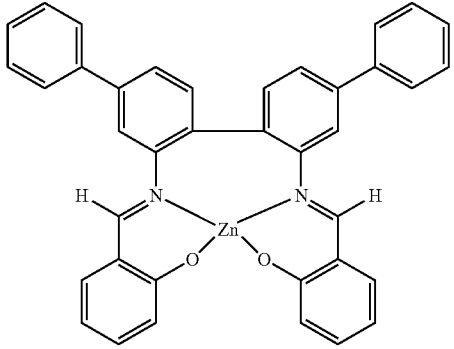
(17)
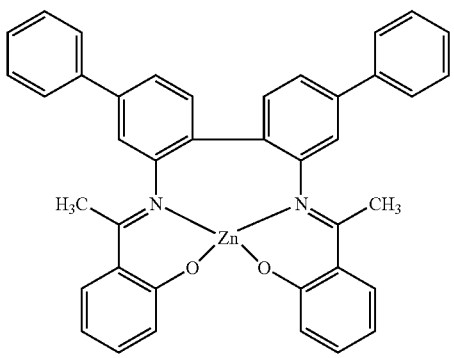
(18)
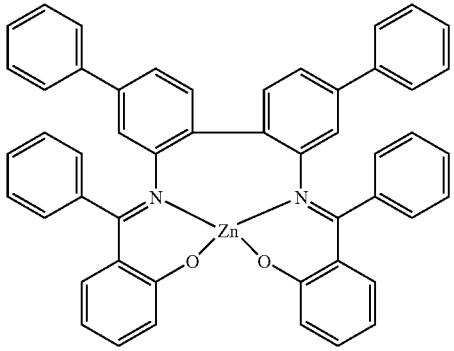
(19)
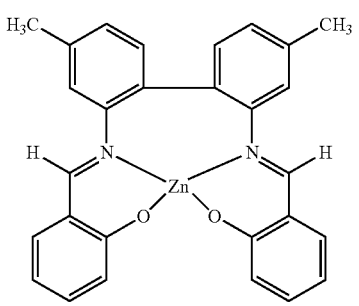
(20)
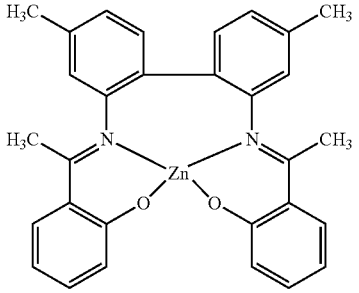

(21)
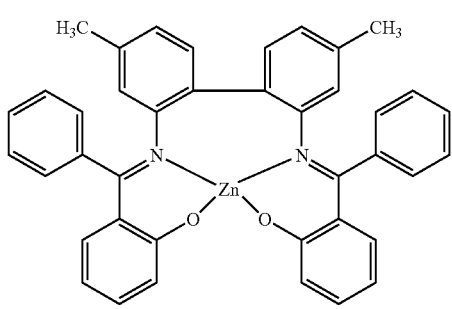
(22)
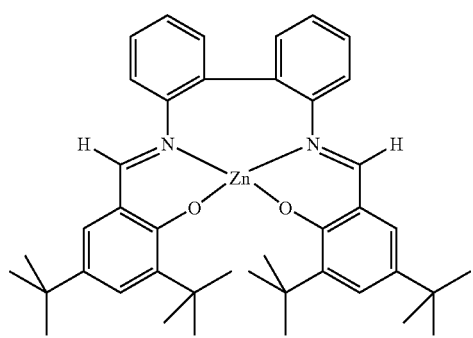
(23)
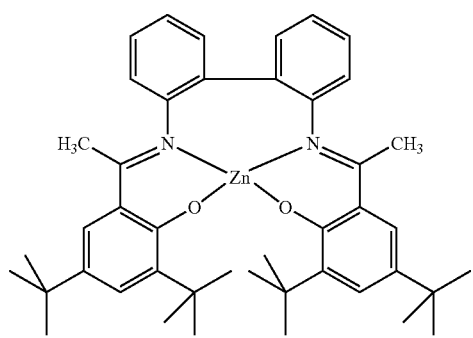
(24)
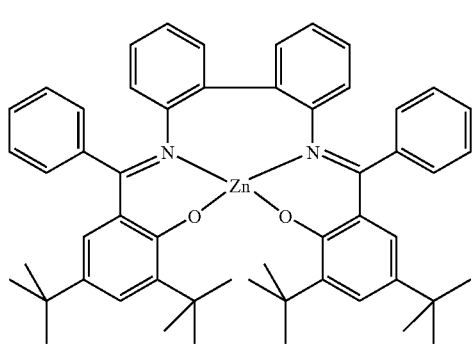
(25)
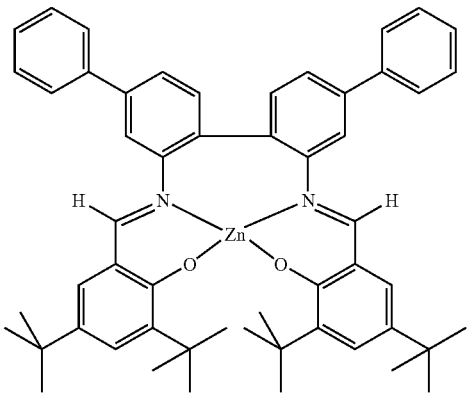
(26)
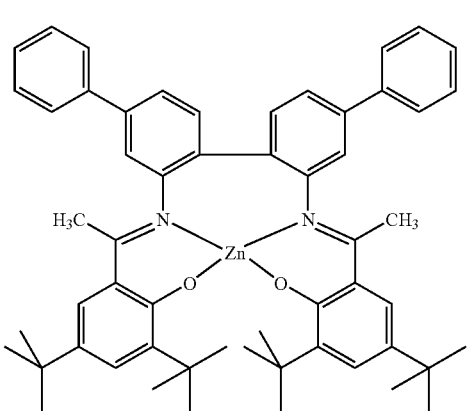
(27)
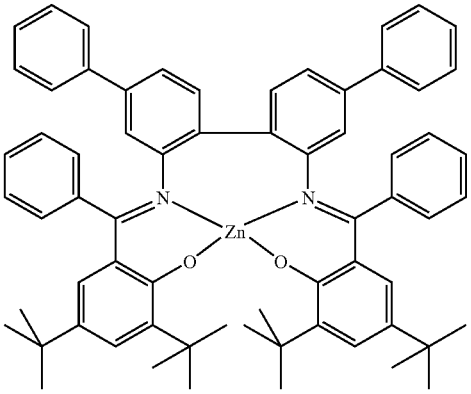
(28)
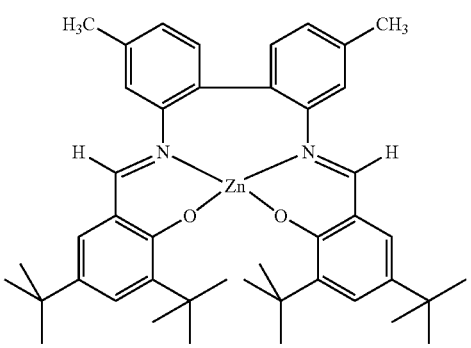

(29) 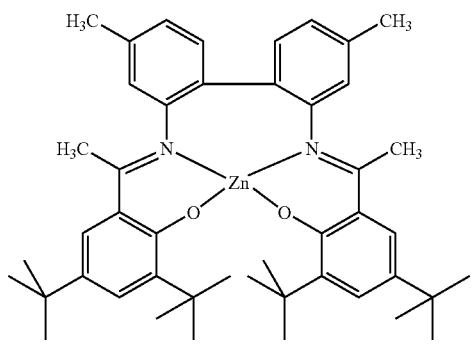
(30) 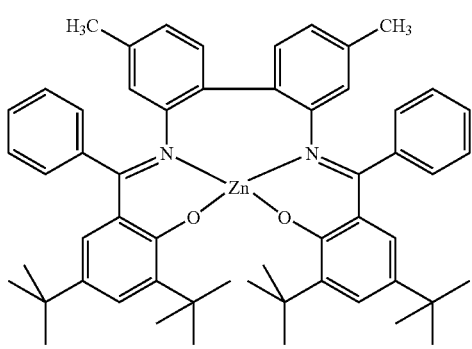
(31) 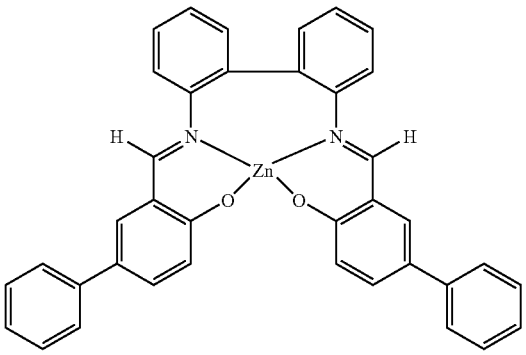
(32) 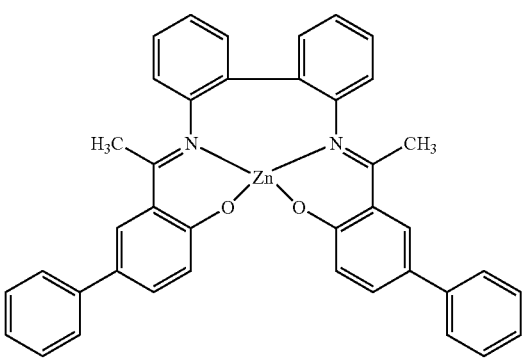
(33) 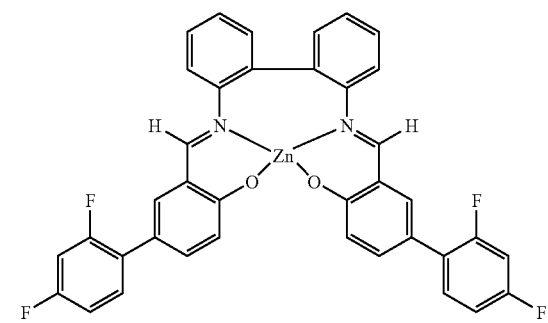
(34) 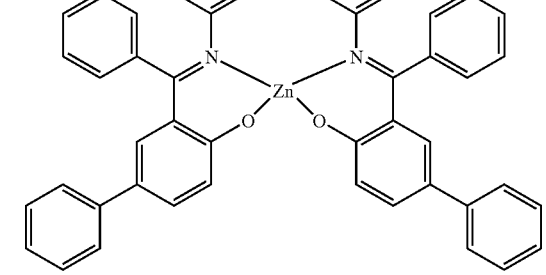
(35) 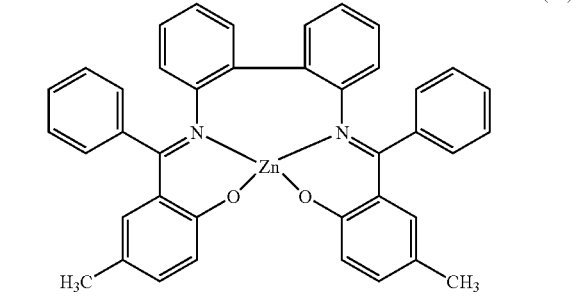
(36)

(37)
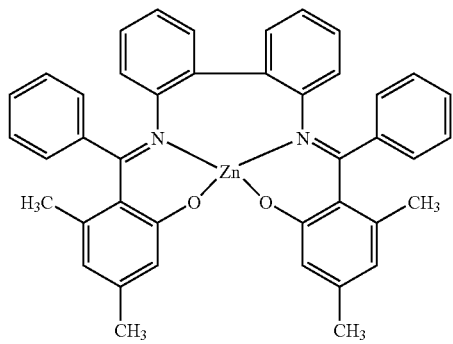
(38)
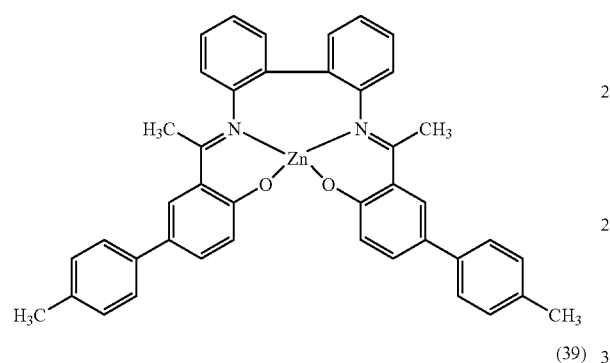
(39)
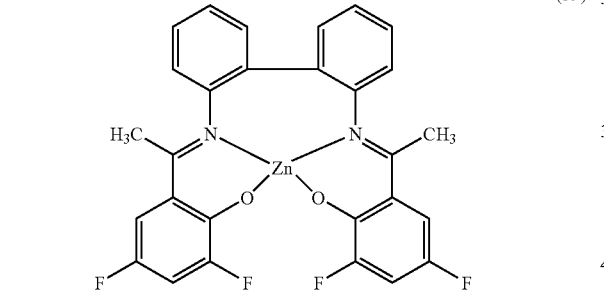
(40)
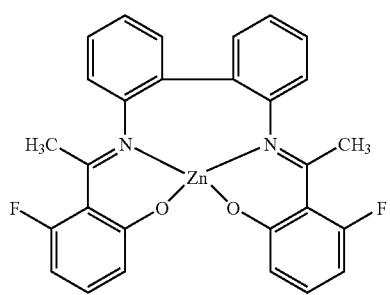
(41)
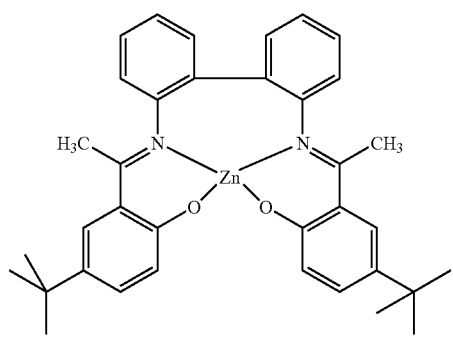
(42)
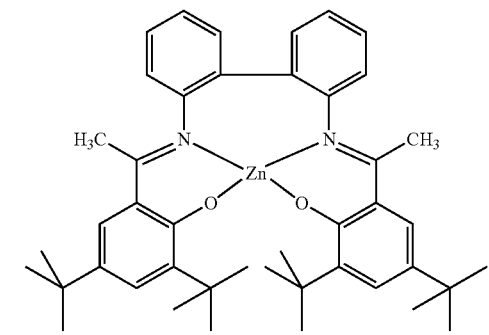
(43)
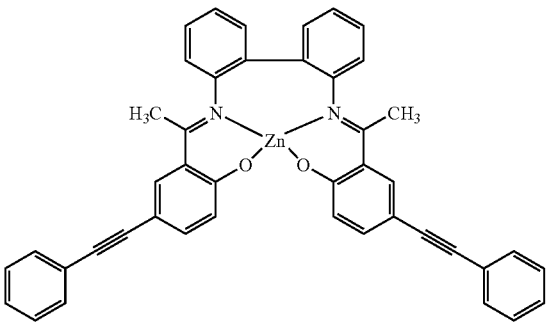
(44)
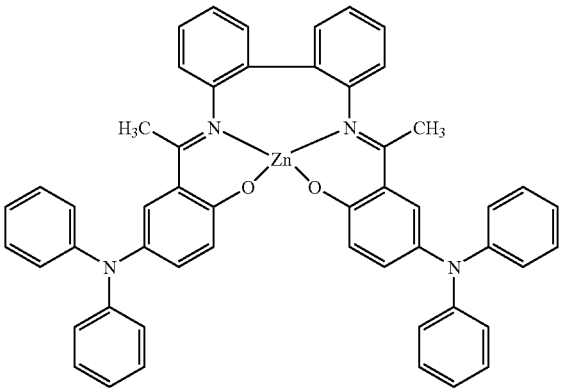
(45)
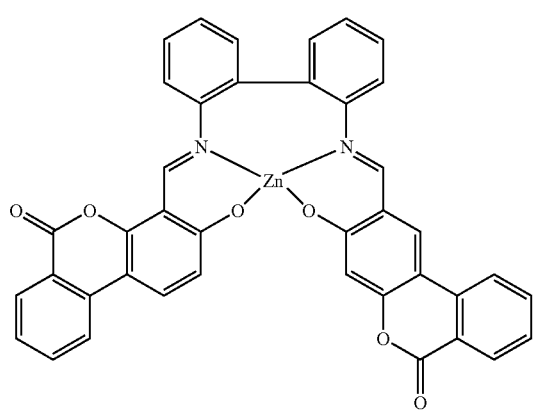

(46)
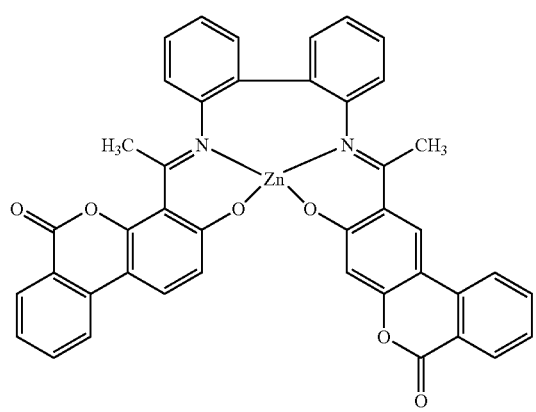
(47)
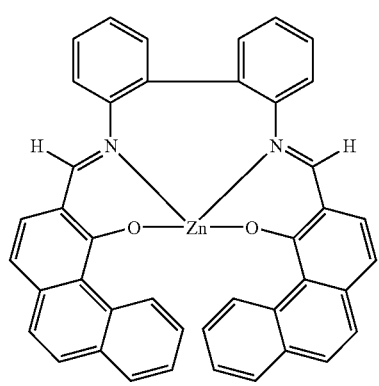
(48)
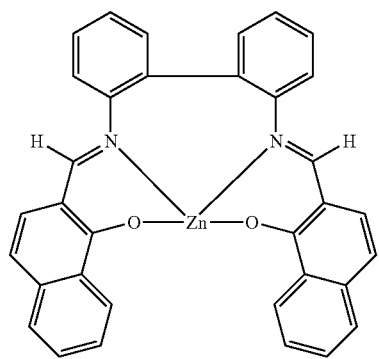
(49)
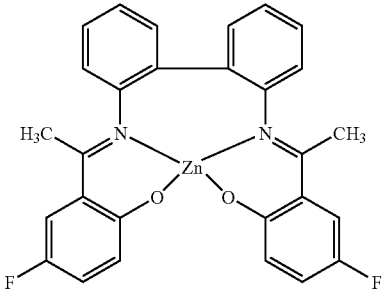
(50)
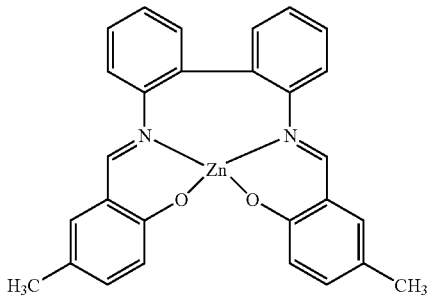
(51)
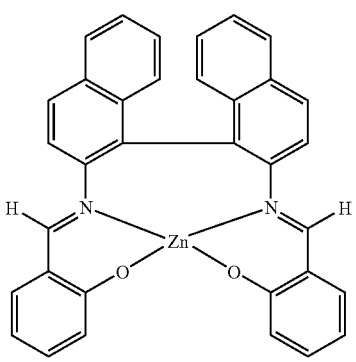
(52)
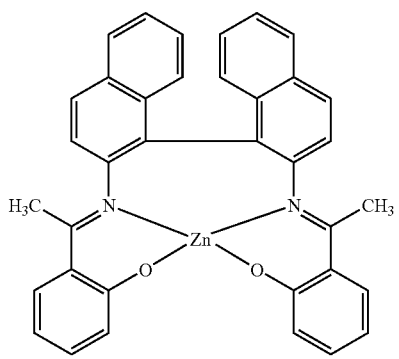
(53)
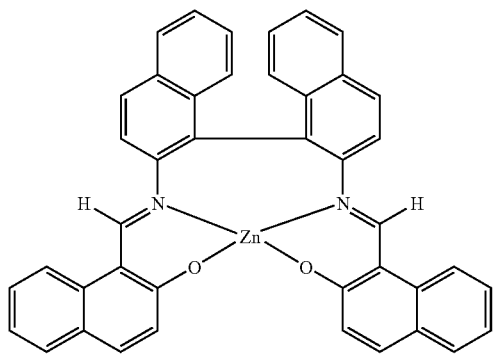

-continued
(54)
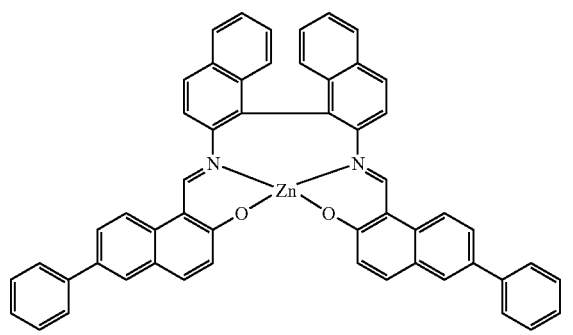
(55)
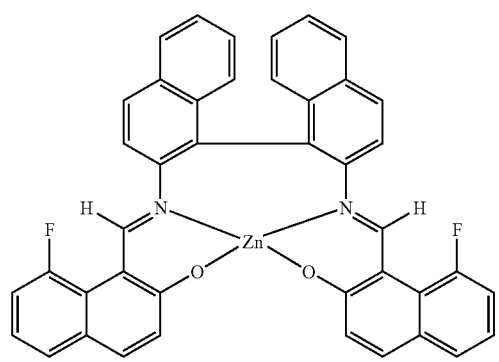
(56)
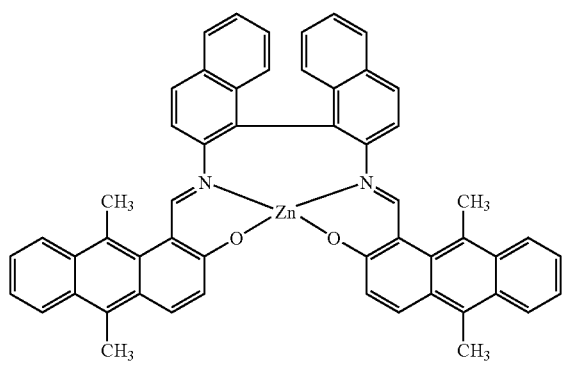
(57)
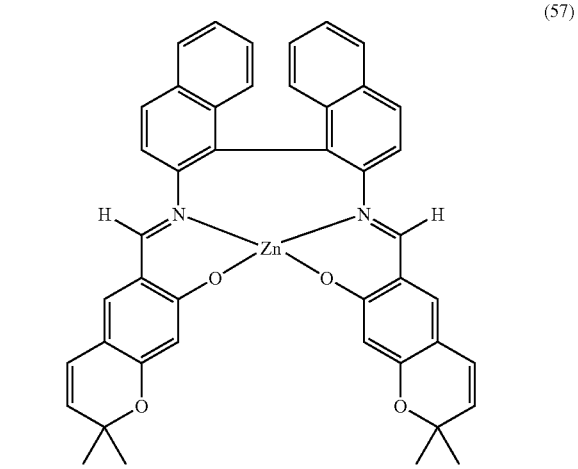
(58)
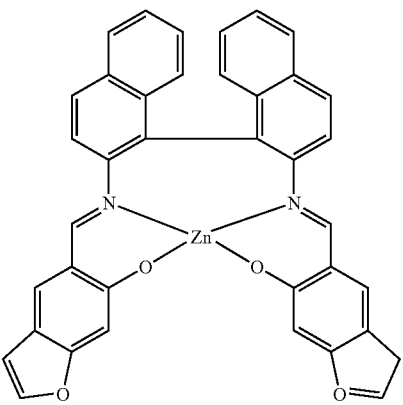
(59)
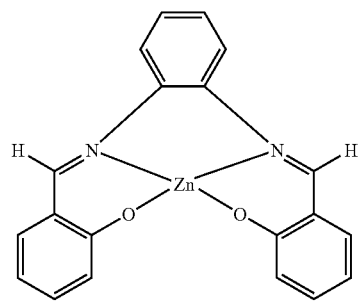
(60)
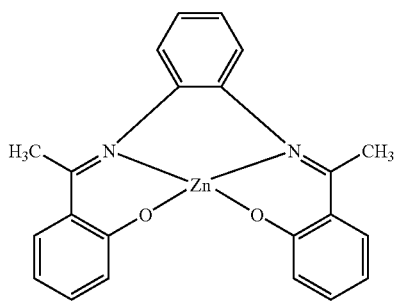
(61)
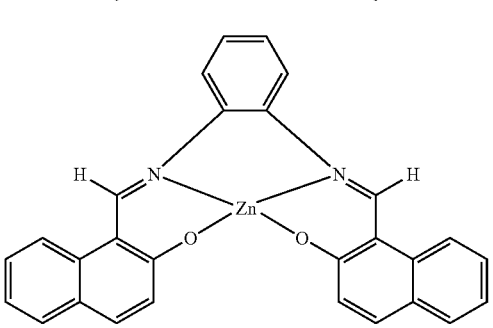
(62)
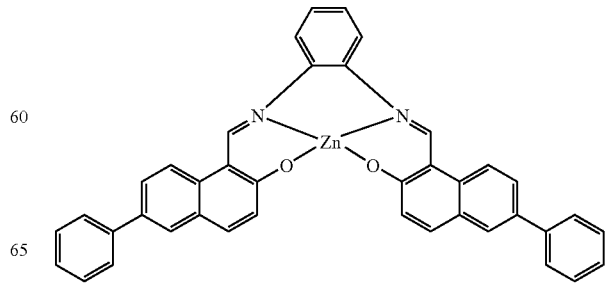

(63)
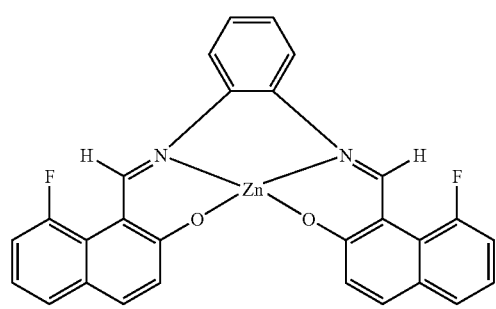
(64)
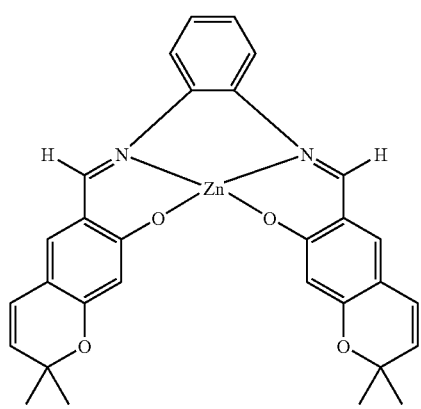
(65)
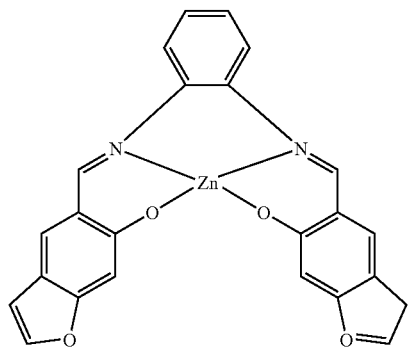
(66)
(67)
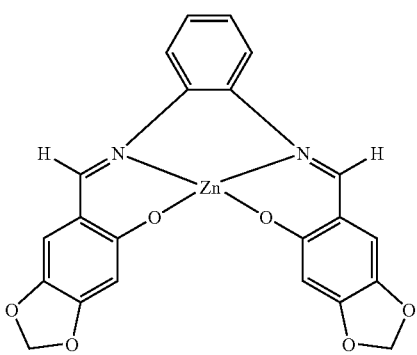
(68)
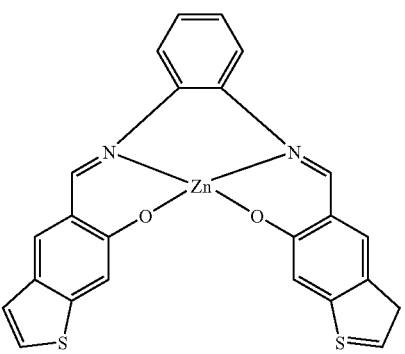
(69)
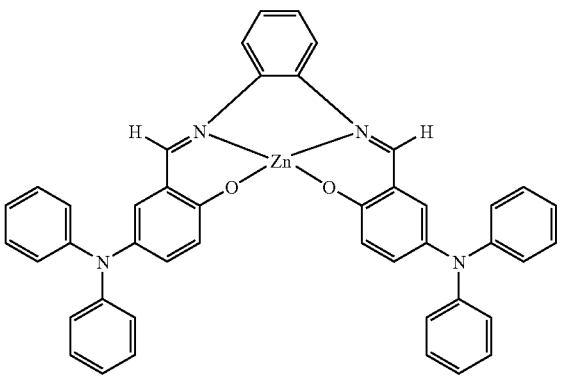
(70)
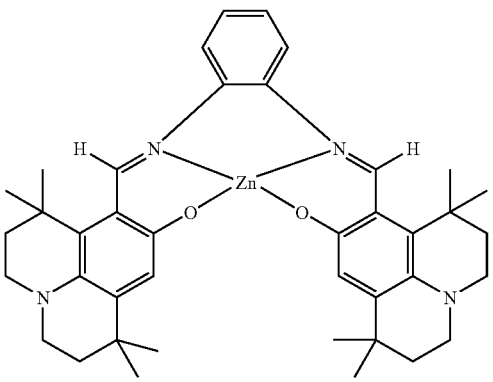

-continued
(71)
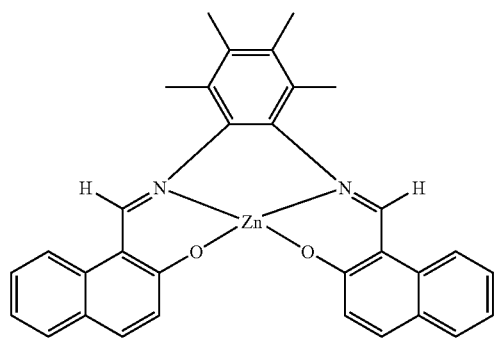
(72)
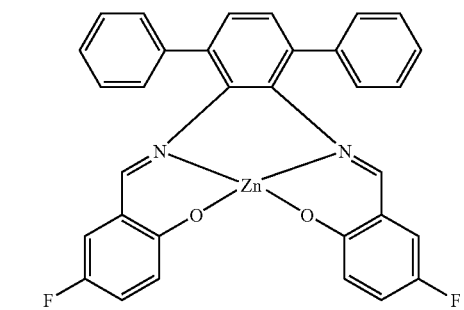
(73)
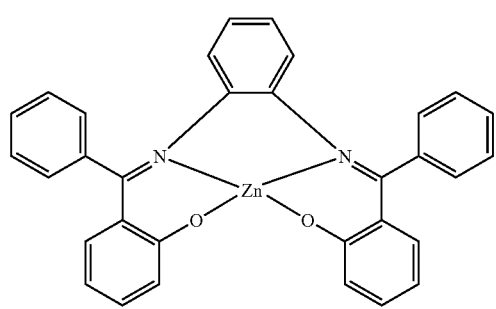
(74)
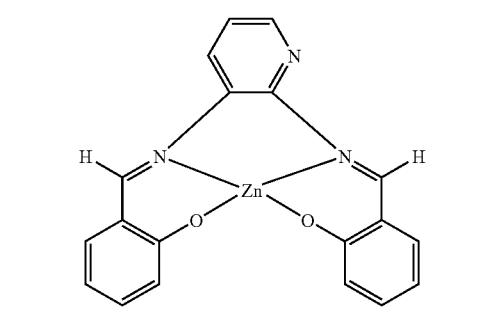
(75)
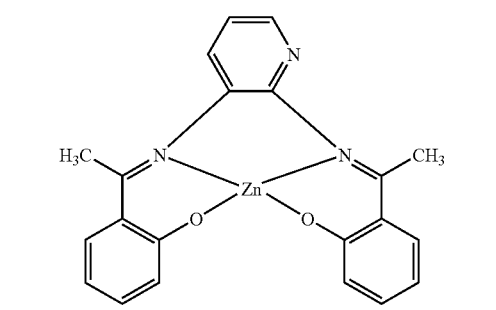
-continued
(76)
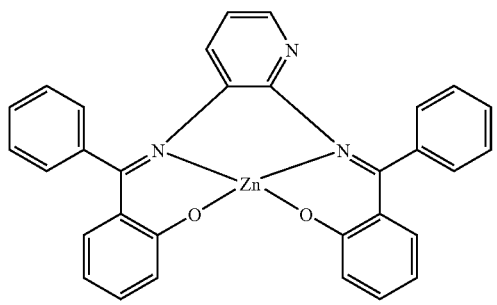
(77)
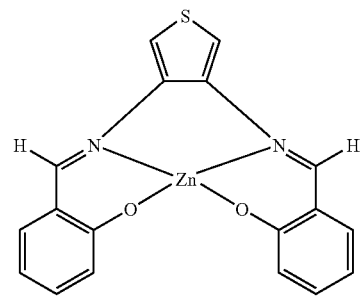
(78)
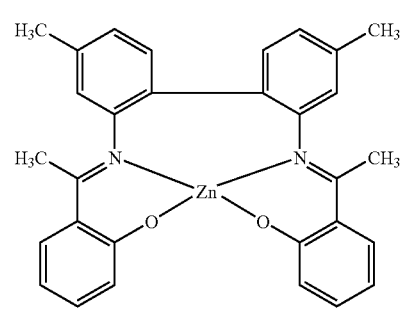
(79)
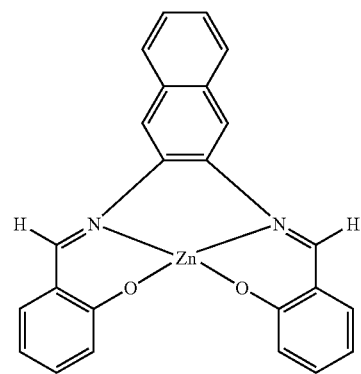

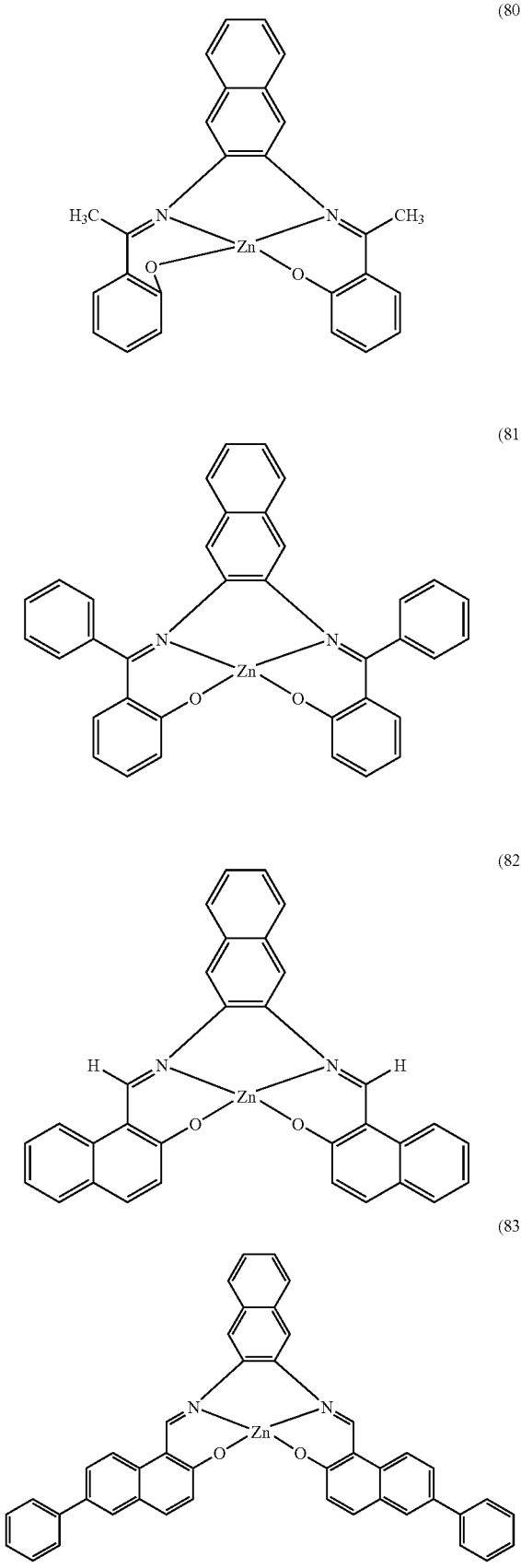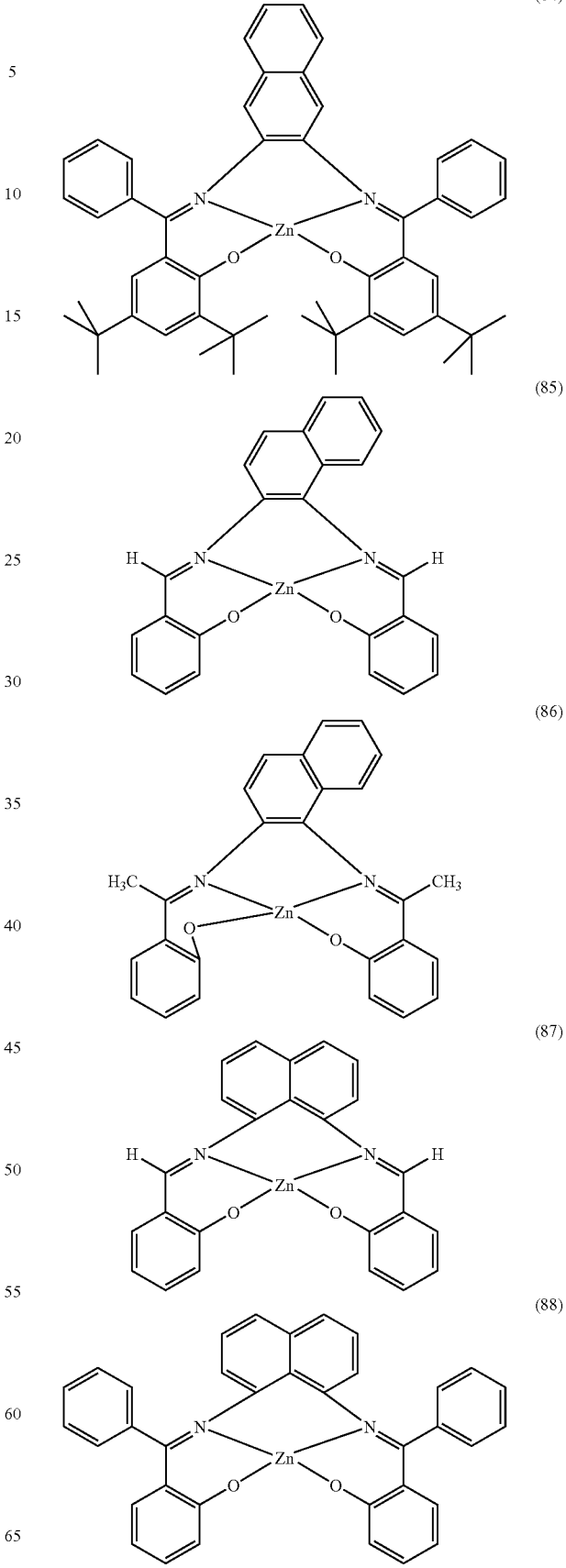

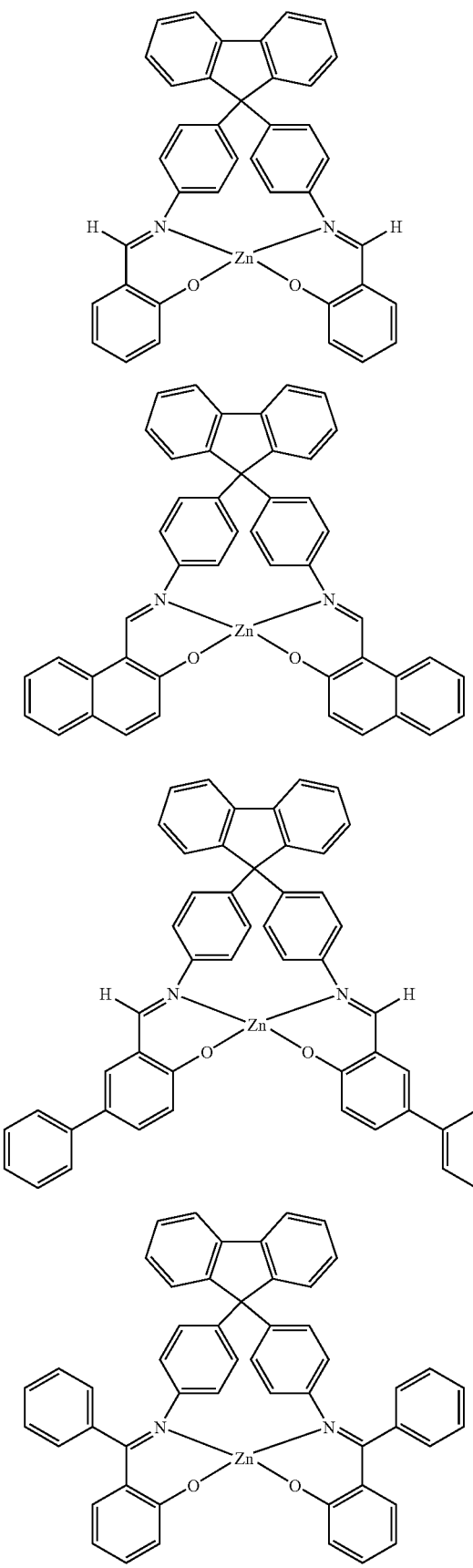

(97) 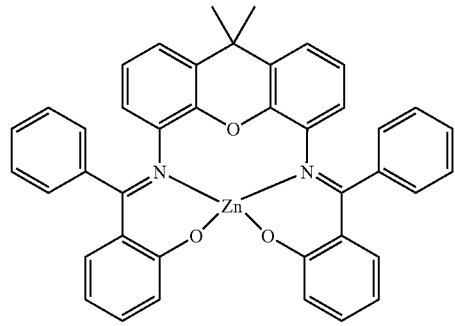
(98) 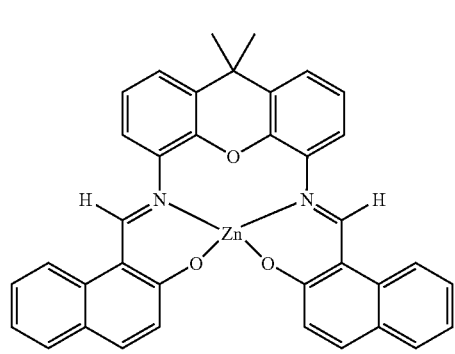
(99) 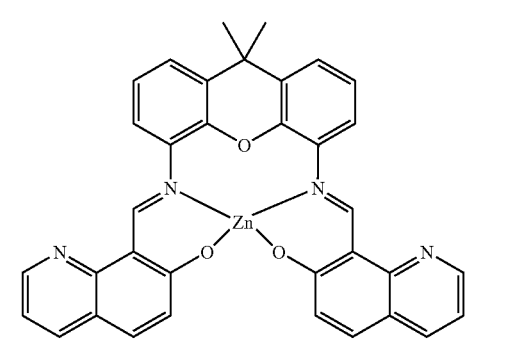
(100)
(101) 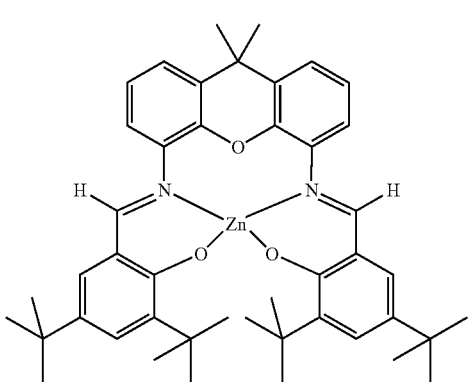
(102) 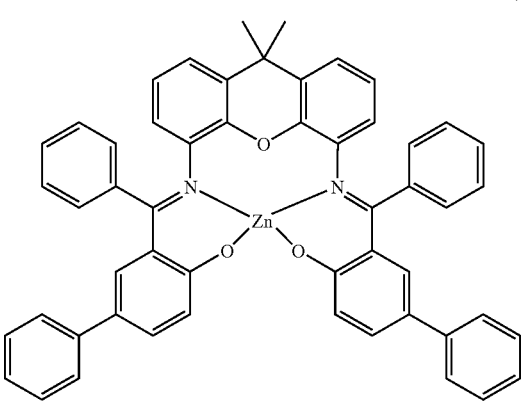
(103) 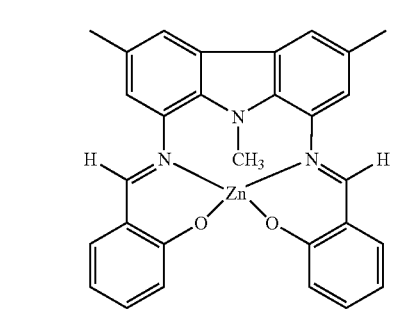
(104) 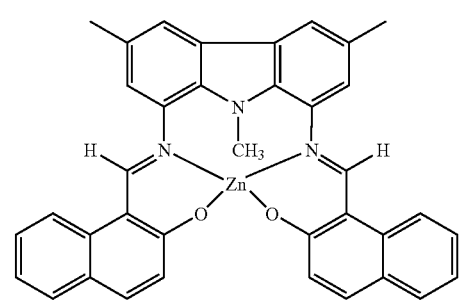

(105)
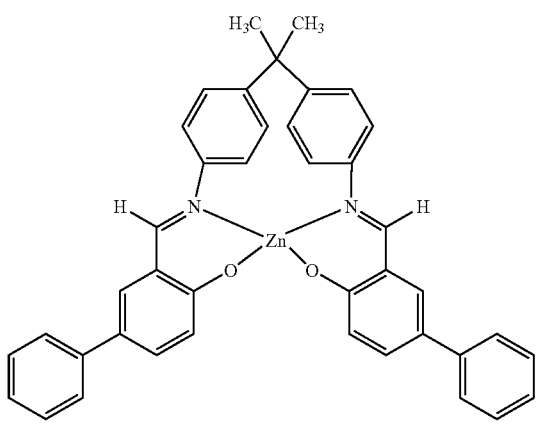
(106)
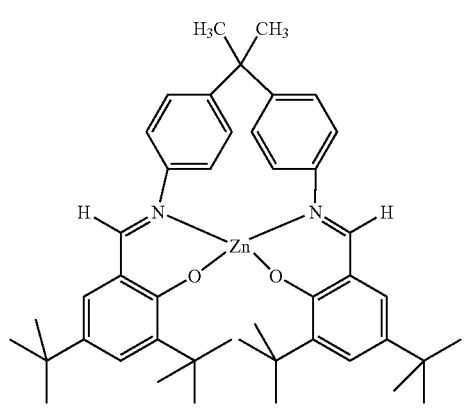
(107)
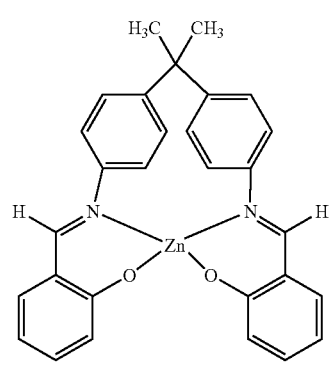
(108)
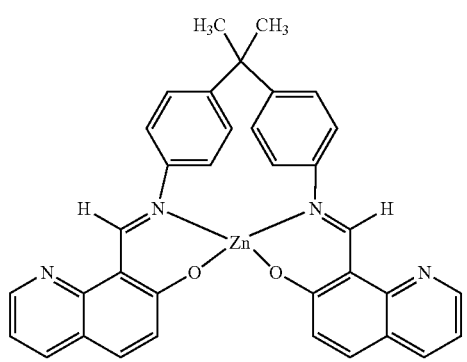
(109)
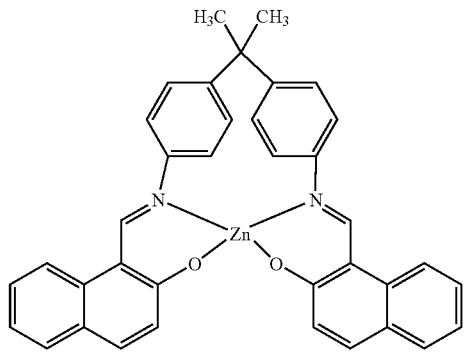
(110)
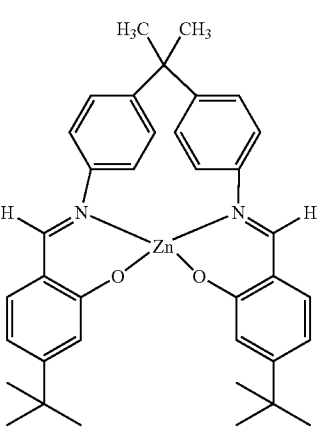
(111)
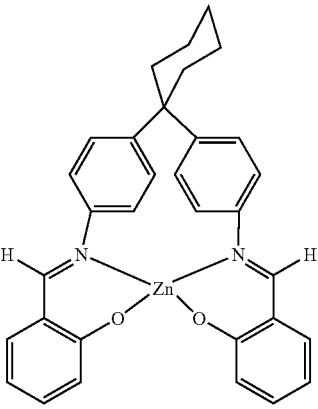
(112)
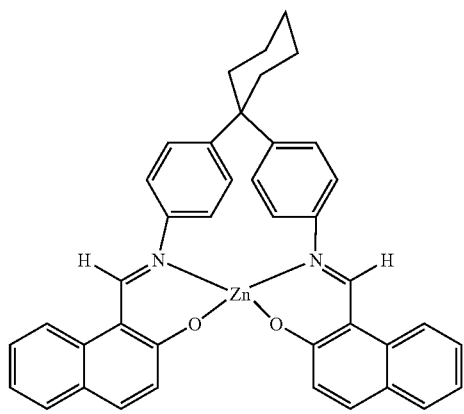

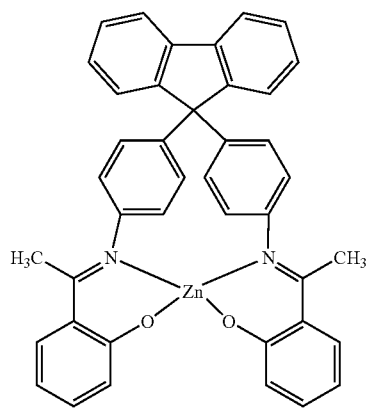
(113)
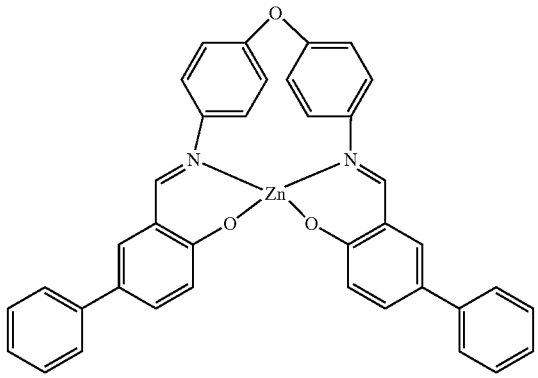
(117)
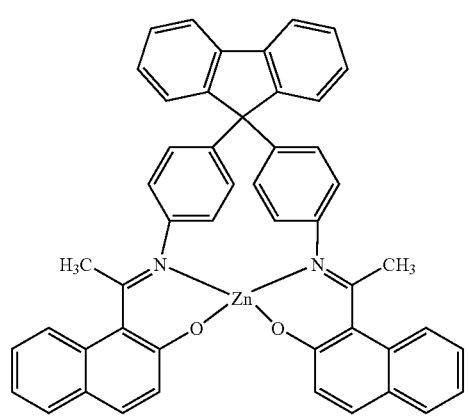
(114)
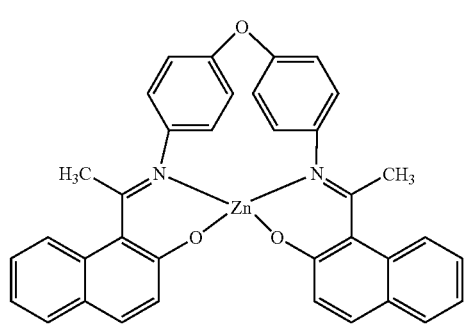
(118)
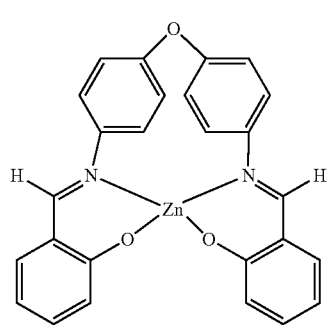
(115)
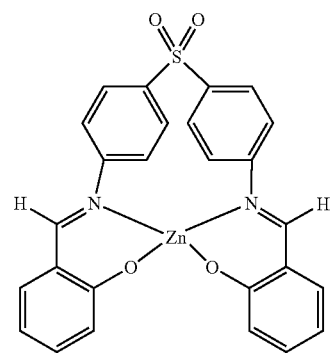
(119)
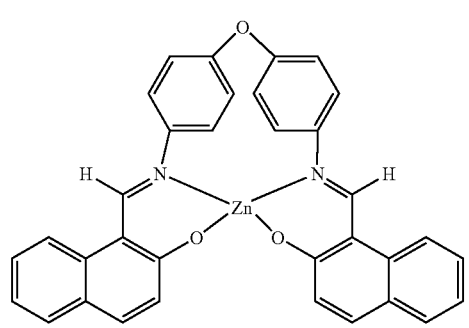
(116)
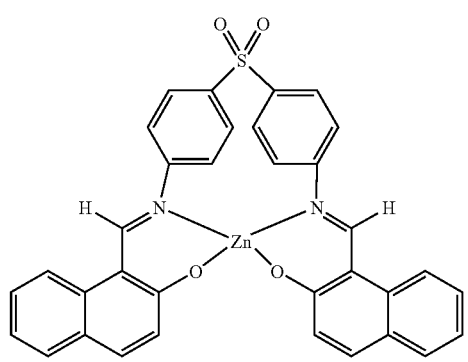
(120)

(121) 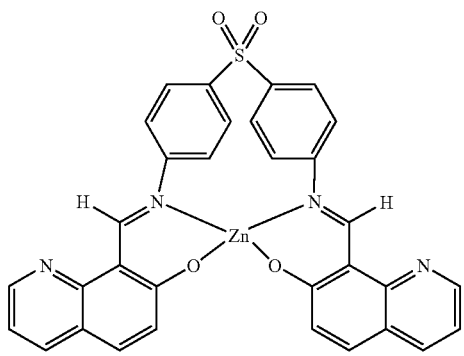
(122) 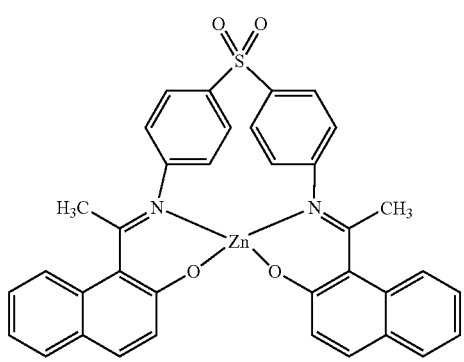
(123) 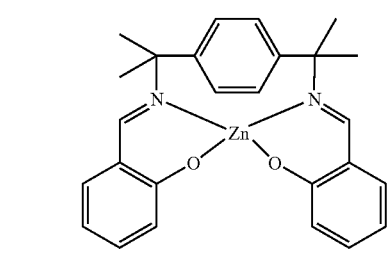
(124) 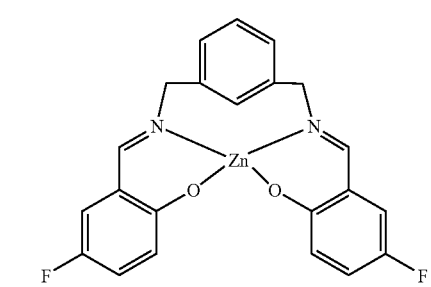
(125) 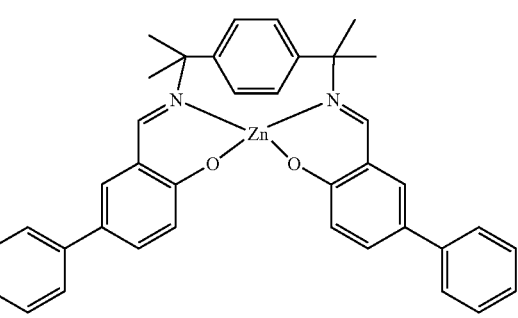
(126) 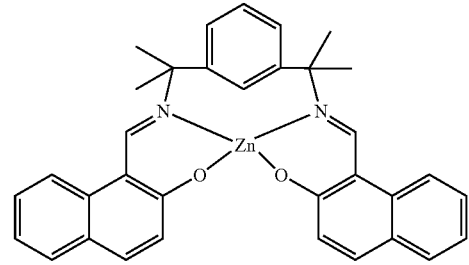
(127) 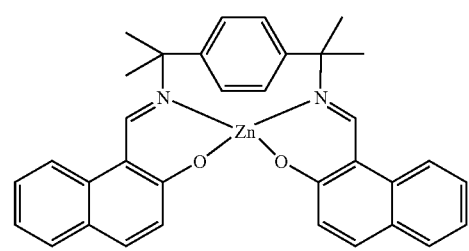
(128) 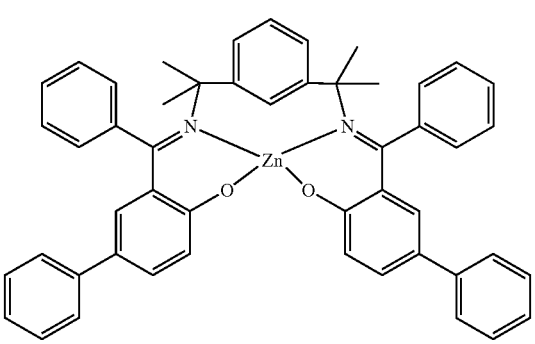
(129) 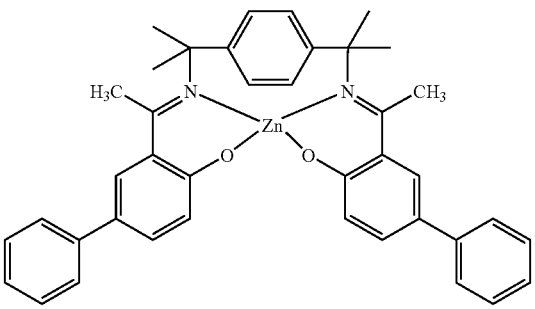
(130) 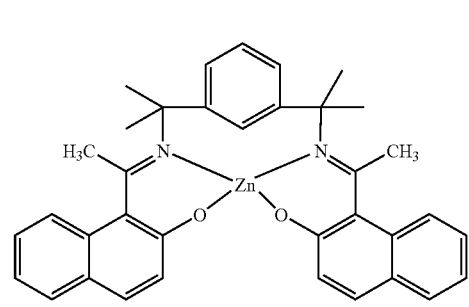

-continued
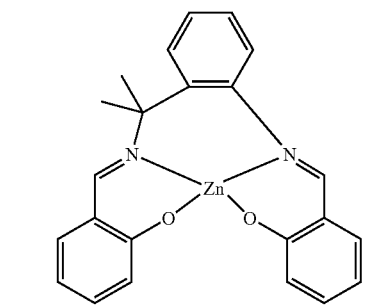
(131)
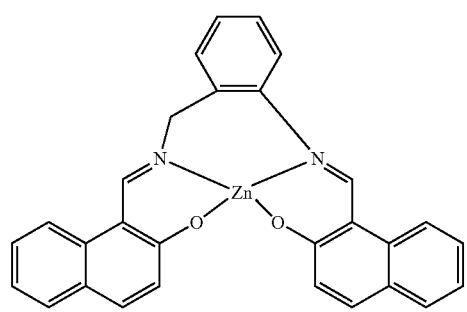
(132)
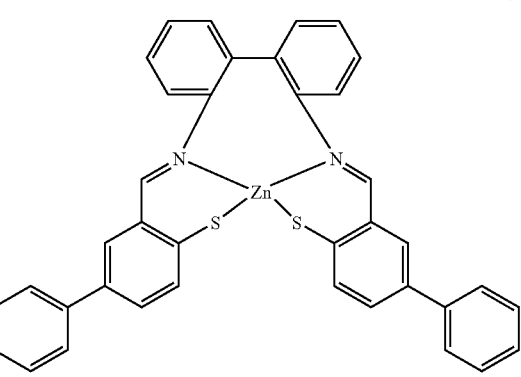
(133)
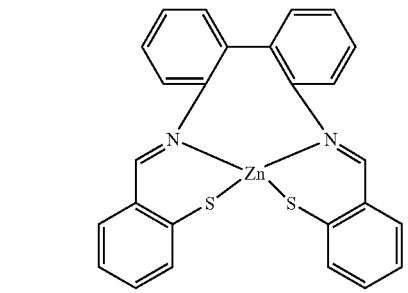
(134)
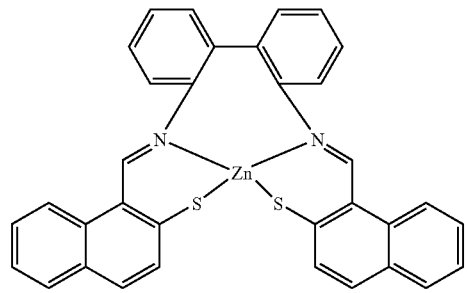
(135)
-continued
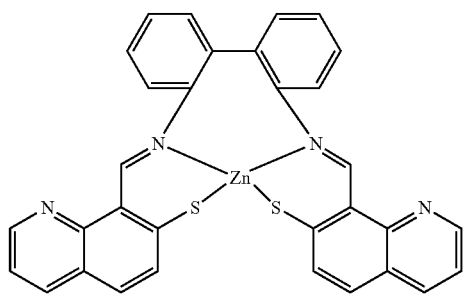
(136)
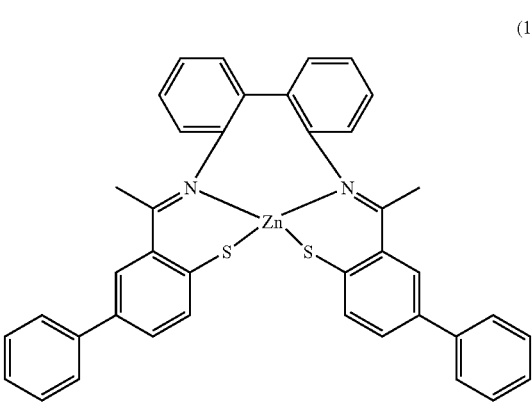
(137)
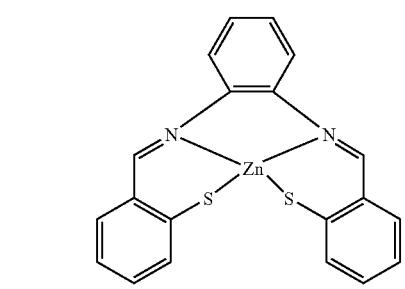
(138)
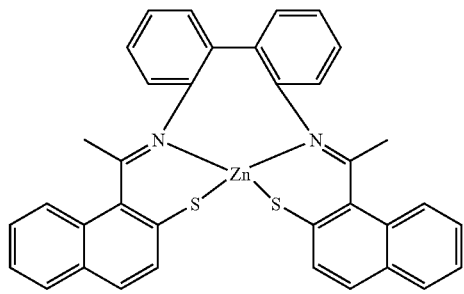
(139)
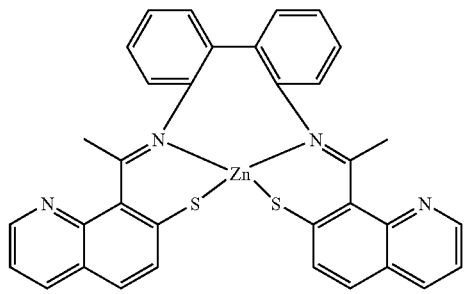
(140)

(141) 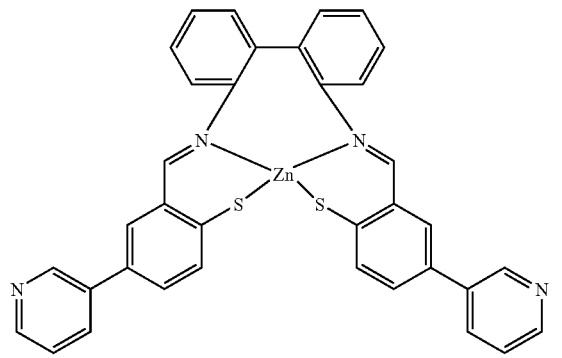
(142) 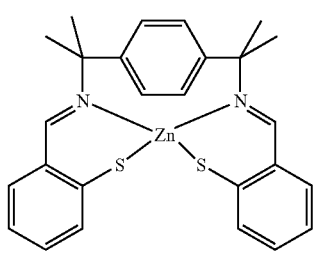
(143) 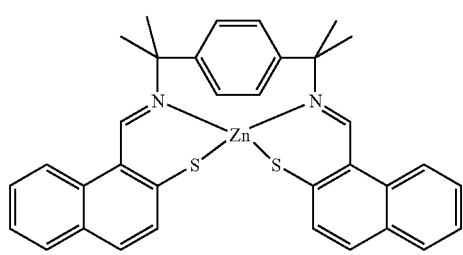
(144) 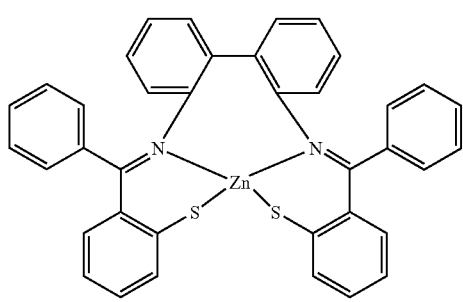
(145) 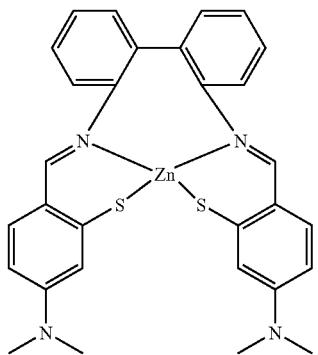
(146) 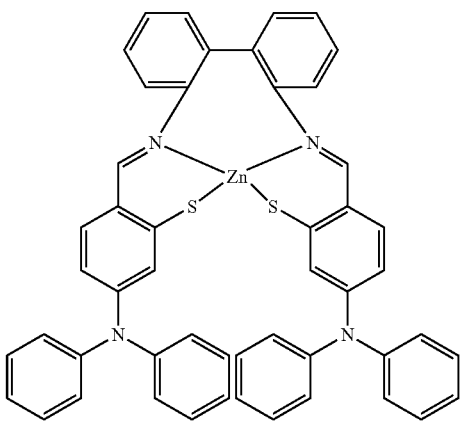
(147) 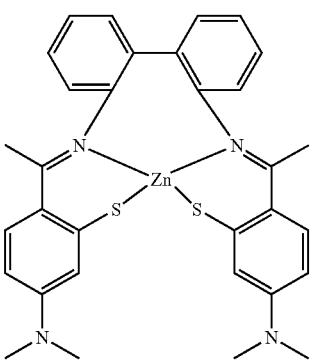
(148) 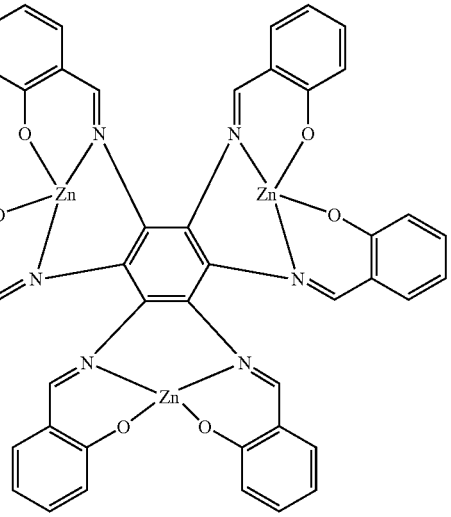

(149)
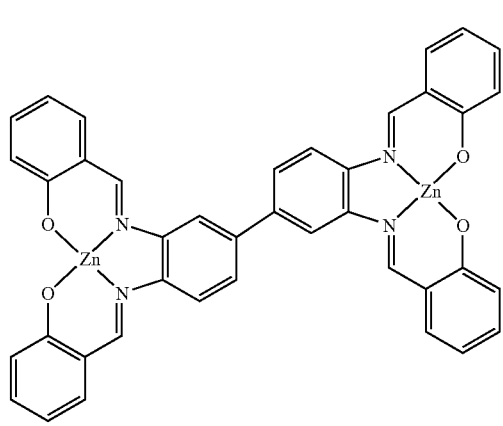
(152)
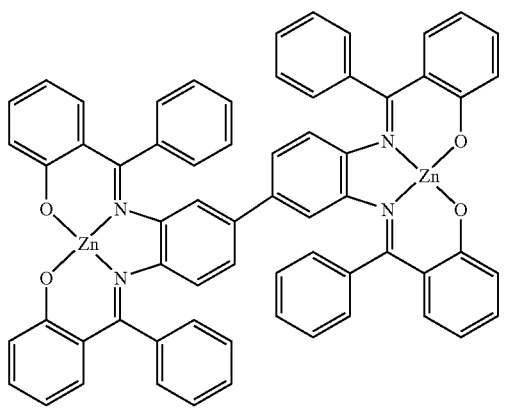
(150)
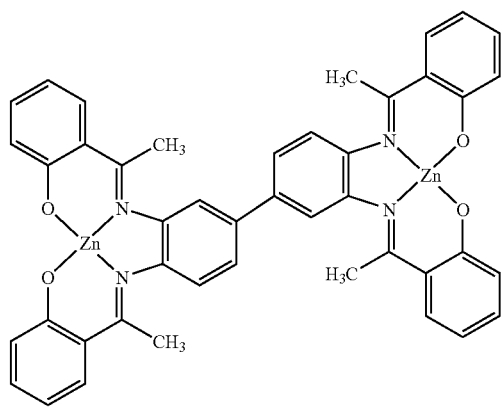
(153)
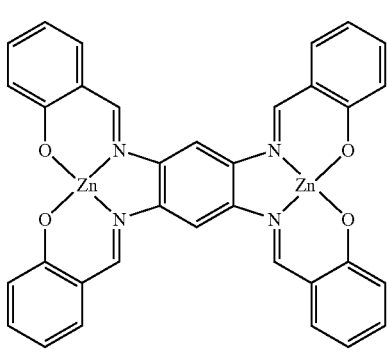
(151)
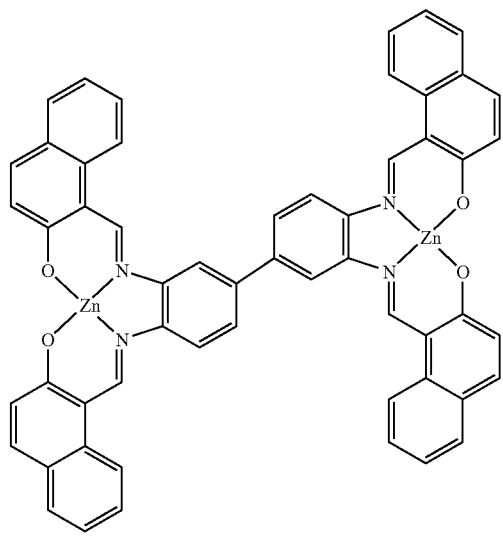
(154)
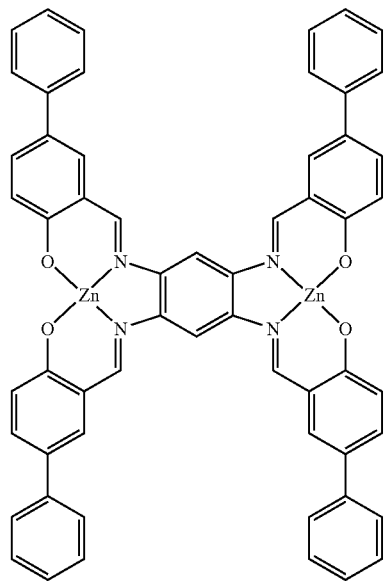

(155)
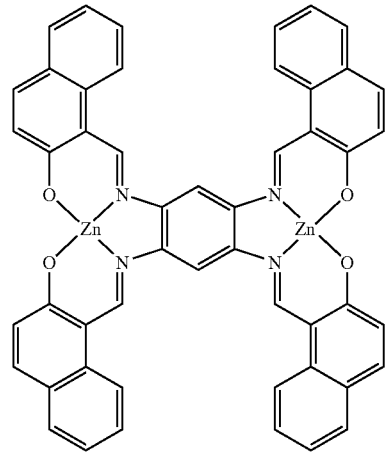
(156)
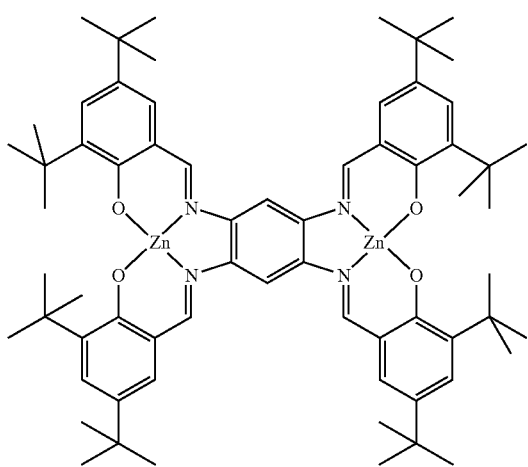
(157)
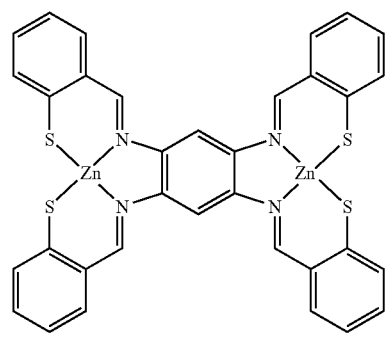
(158)
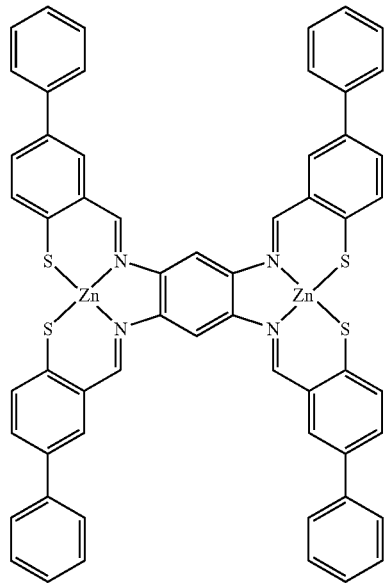
(159)
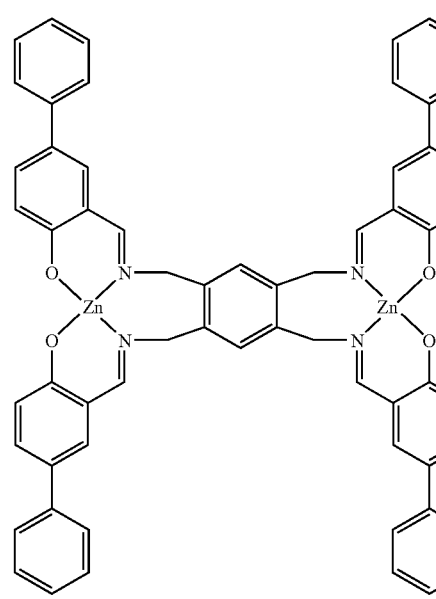
(160)
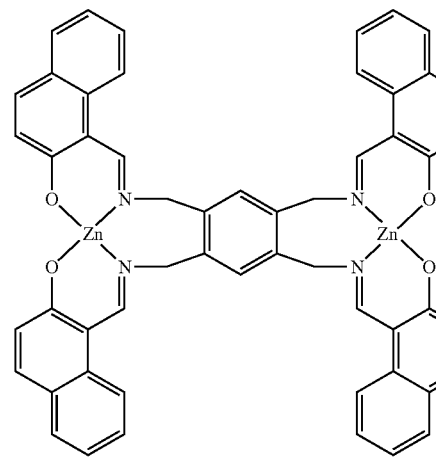

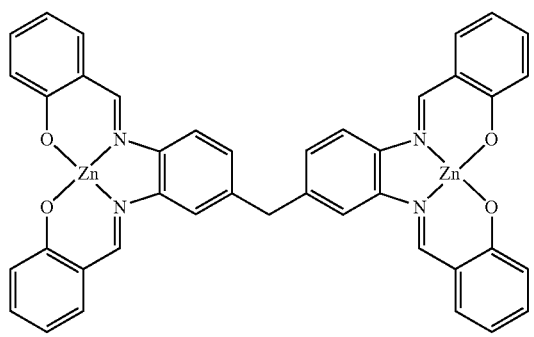
(161)
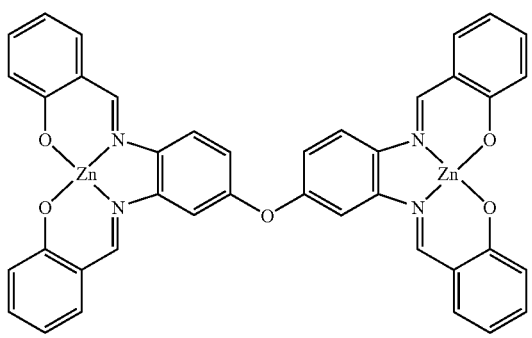
(165)
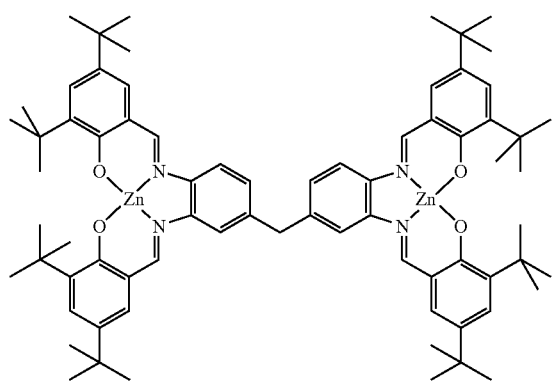
(162)
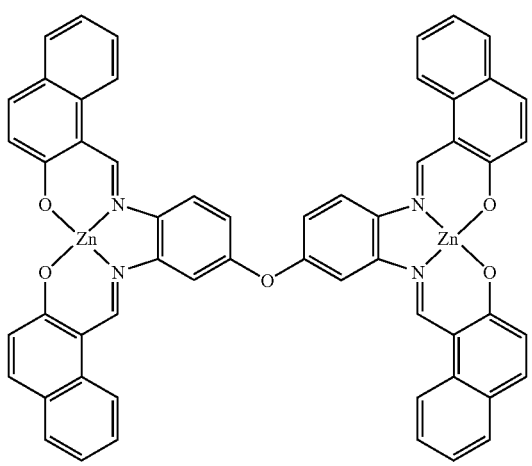
(166)
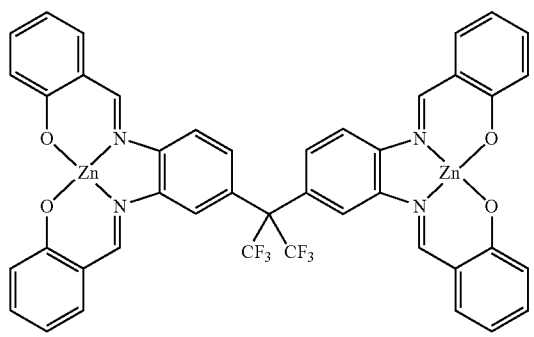
(163)
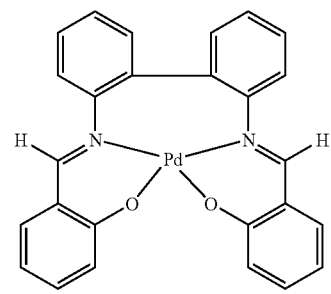
(167)
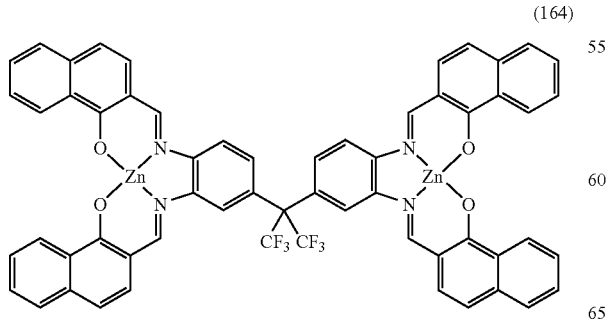
(164)
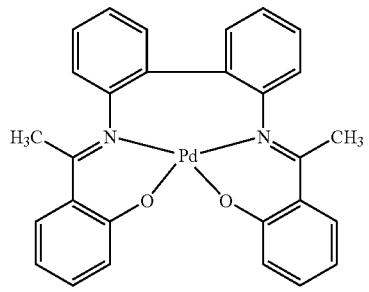
(168)

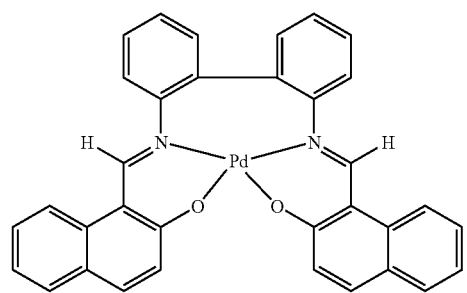
(169)
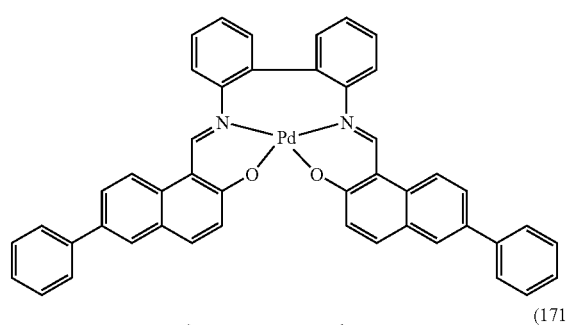
(170)
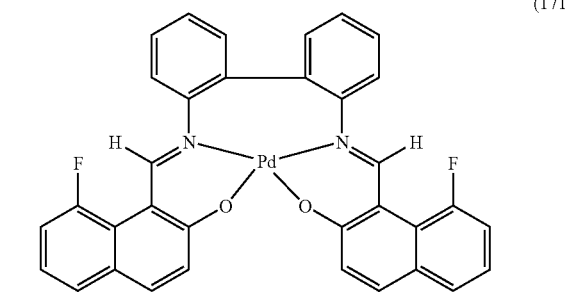
(171)
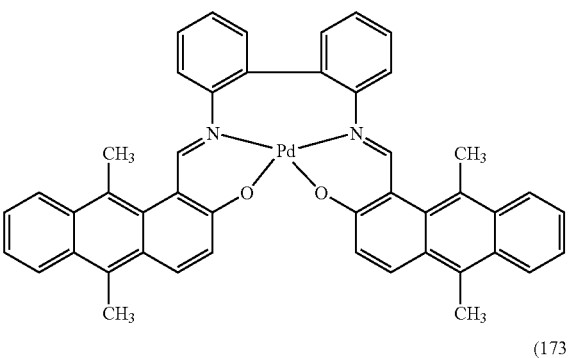
(172)
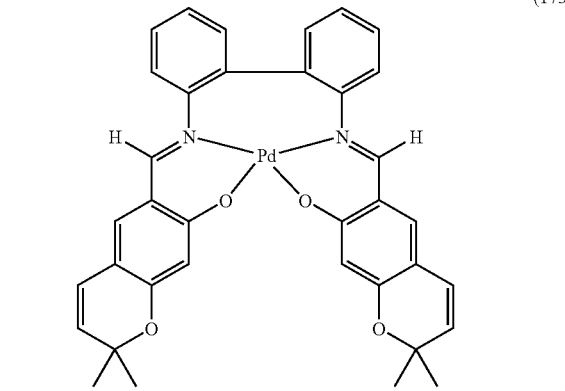
(173)
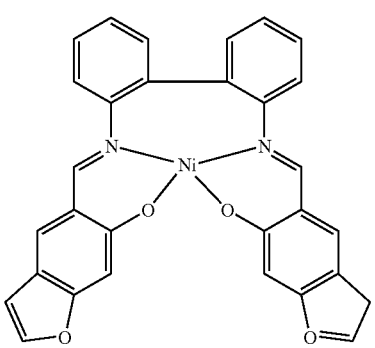
(174)
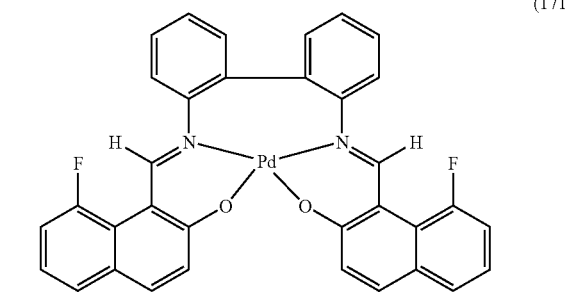
(175)
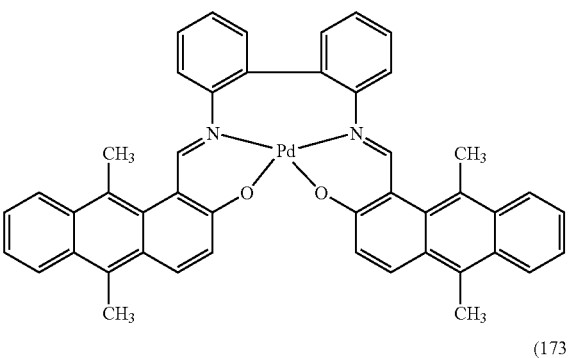
(176)
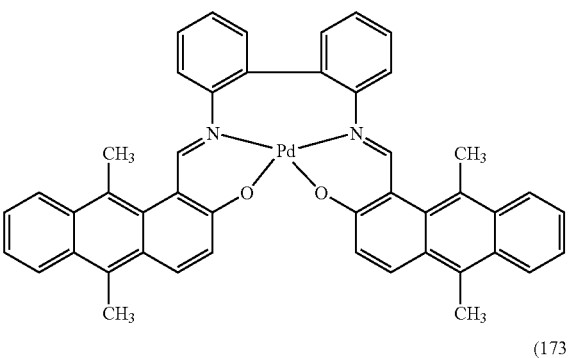
(177)
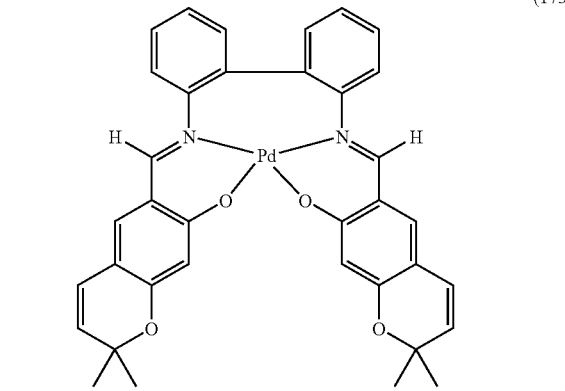
(178)

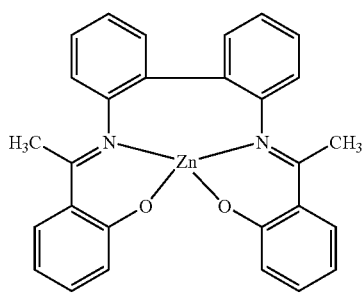

(179)

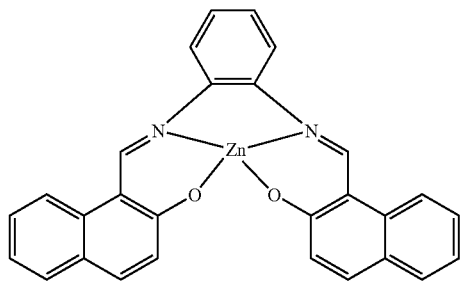

(180)

The compounds of the formula (I) can be synthesised by standard methods of organic chemistry. In particular, two synthesis possibilities are suitable here. Thus, it is possible firstly to synthesise the ligand from the corresponding diamine and an aldehyde or ketone with formation of a Schiff base, which is then reacted, in a further step, with a suitable metal salt to give the corresponding metal complex. It is furthermore also possible to carry out the ligand synthesis and the complexing reaction in one step (template synthesis) by reacting a diamine, an aldehyde or ketone and a suitable metal salt with one another simultaneously (*Eur. J. Inorg. Chem.* 2004, 4561-65).

The compounds of the formula (I) serve as matrix materials for the phosphorescent emitters used in the emitting layer in the organic electroluminescent devices.

The invention therefore furthermore relates to the use of compounds of the formula (I) as matrix material for phosphorescent compounds in organic electroluminescent devices.

The organic electroluminescent device comprises cathode, anode and at least one emitting layer. In addition to these layers, it may also comprise further layers, for example in each case one or more hole-injection layers, hole-transport layers, electron-blocking layers, hole-blocking layers, electron-transport layers, electron-injection layers, charge-generation layers (IDMC 2003, Taiwan; Session 21 OLED (5), T. Matsumoto, T. Nakada, J. Endo, K. Mori, N. Kawamura, A. Yokoi, J. Kido, *Multiphoton Organic EL Device Having Charge Generation Layer*) and/or organic or inorganic p/n junctions. It is likewise possible for interlayers which have, for example, an exciton-blocking function to be introduced between two emitting layers. However, it should be pointed out that each of these layers does not necessarily have to be present.

In a preferred embodiment of the invention, the emitting layer which comprises the compound of the formula (I) and the phosphorescent emitter is a red-, green- or blue-emitting layer.

In a further preferred embodiment of the invention, the organic electroluminescent device comprises a plurality of emitting layers, where at least one layer comprises at least one compound of the formula (I) and at least one phosphorescent compound. The emission layers particularly preferably have in total a plurality of emission maxima between 380 nm and 750 nm, resulting overall in white emission, i.e. various emitting compounds which are able to fluoresce or phosphoresce are used in the emitting layers. Particular preference is given to three-layer systems in which the three layers exhibit blue, green and orange or red emission (for the basic structure see, for example, WO 05/011013).

The phosphorescent compounds (=triplet emitters) comprise at least one compound which emits light, preferably in the visible region, on suitable excitation and in addition contains at least one atom having an atomic number greater than 20, preferably greater than 38 and less than 84, particularly preferably greater than 56 and less than 80. The phosphorescent emitters used are preferably compounds which contain copper, molybdenum, tungsten, rhenium, ruthenium, osmium, rhodium, iridium, palladium, platinum, silver, gold or europium, in particular compounds which contain iridium or platinum.

Particularly preferred organic electroluminescent devices contain, as phosphorescent emitters, at least one compound of the formulae (XXII) to (XXV)

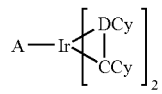

(XXII)

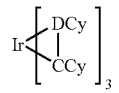

(XXIII)

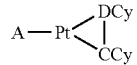

(XXIV)

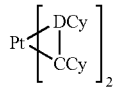

(XXV)

where R has the same meaning as described above for formula (I), and the following applies to the other symbols used:

DCy is, identically or differently on each occurrence, a cyclic group which contains at least one donor atom, preferably nitrogen, carbon in the form of a carbene or phosphorus, via which the cyclic group is bonded to the metal, and which may in turn carry one or more substituents R; the groups DCy and CCy are connected to one another via a covalent bond;

CCy is, identically or differently on each occurrence, a cyclic group which contains a carbon atom via which the cyclic group is bonded to the metal and which may in turn carry one or more substituents R;

A is, identically or differently on each occurrence, a monoanionic, bidentate chelating ligand, preferably a diketonate ligand.

The formation of ring systems between a plurality of radicals R may also produce a bridge between the groups DCy and CCy.

Examples of the emitters described above are revealed by the applications WO 00/70655, WO 01/41512, WO 02/02714, WO 02/15645, EP 1191613, EP 1191612, EP 1191614 and WO 05/033244. In general, suitable phosphorescent complexes are all those as are used in accordance with the prior art for phosphorescent OLEDs and as are known to the person skilled in the art in the area of organic electroluminescence.

The mixture of the at least one compound of the formula (I) and the at least one phosphorescent emitter comprises between 1 and 99% by weight, preferably between 2 and 90% by weight, particularly preferably between 3 and 40% by weight, in particular between 5 and 15% by weight, of the at least one phosphorescent emitter, based on the entire mixture of emitter and matrix material. Correspondingly, the mixture comprises between 99 and 1% by weight, preferably between 98 and 10% by weight, particularly preferably between 97 and 60% by weight, in particular between 95 and 85% by weight, of the at least one matrix material of the formula (I), based on the entire mixture of emitter and matrix material. Besides the matrix material of the formula (I), the entire mixture may also comprise further matrix materials.

Preference is furthermore given to an organic electroluminescent device which is characterised in that one or more layers are applied by means of a sublimation process, in which the materials are vapour-deposited in vacuum sublimation units at a pressure below $10^{-5}$ mbar, preferably below $10^{-6}$ mbar.

Preference is likewise given to an organic electroluminescent device which is characterised in that one or more layers are applied by means of the OVPD (organic vapour phase deposition) process or with the aid of carrier-gas sublimation, in which the materials are applied at a pressure between $10^{-5}$ mbar and 1 bar. A special case of this process is the OVJP (organic vapour jet printing) process, in which the materials are applied directly through a nozzle and are thus structured (for example M. S. Arnold et al., *Appl. Phys. Lett.* 2008, 92, 053301).

Preference is furthermore given to an organic electroluminescent device which is characterised in that one or more layers are produced from solution, such as, for example, by spin coating, or by means of any desired printing process, such as, for example, screen printing, flexographic printing or offset printing, but particularly preferably LITI (light induced thermal imaging, thermal transfer printing) or ink-jet printing. Soluble compounds are necessary for this purpose.

These processes are known in general to the person skilled in the art and can be applied by him without problems to the system according to the invention comprising compounds of the formula (I) and triplet emitters.

The compounds of the formula (I) have the following surprising advantages over the prior art on use in organic electroluminescent devices:
1. The operating voltage is considerably reduced on use of compounds of the formula (I) compared with B-Alq and other aluminium complexes, which results in significantly higher power efficiency.
2. The lifetime of the devices is also improved on use of the compounds of the formula (I) as triplet matrix materials.
3. Furthermore, the efficiency of the devices is improved on use of the compounds of the formula (I) as triplet matrix materials.
4. The compounds of the formula (I) have a significantly higher glass transition temperature than CBP, which is frequently used in accordance with the prior art as triplet matrix material.

These above-mentioned advantages are not accompanied by impairment of the other electronic properties.

The invention is explained in greater detail by the following examples without wishing it to be restricted thereby.

EXAMPLES

The following syntheses are carried out under a protective-gas atmosphere in dried solvents, unless indicated otherwise.

The starting materials can be purchased from ALDRICH or are prepared by processes known from the literature. The synthesis of 2,2'-diaminobiphenyl from 2,2'-dinitrobiphenyl is carried out in accordance with the process described in *Chem. Commun.* 2005, 46, 5799-5801. The synthesis of 4,4'-dibromo-2,2'-dinitrobiphenyl is described in *J. Am. Chem. Soc.* 2006, 128, 9034-9035. The synthesis of 2-mercaptobenzaldehyde is described in *Synlett* 2001, 1956-1958.

Example 1

Synthesis of 3',2''-diamino-p-quaterphenyl a) Preparation of 3',2''-dinitro-p-quaterphenyl

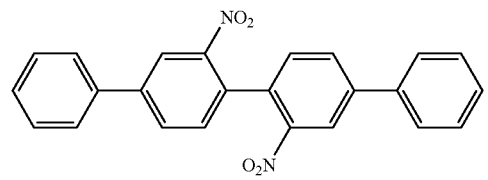 [SMILES: O=[N+]([O-])c1cc(-c2ccccc2)ccc1-c1ccc(-c2ccccc2)cc1[N+](=O)[O-]]

2.4 g (2.1 mmol) of Pd(PPh$_3$)$_4$ are added to a well-stirred, degassed suspension of 18.8 g (154.5 mmol) of phenylboronic acid, 30 g (74.6 mmol) of 2,5-dibromonitrobenzene and 53 g (212.7 mmol) of potassium carbonate in a mixture of 300 ml of water and 300 ml of THF, and the mixture is heated under reflux for 20 hours. After cooling, the organic phase is separated off, washed three times with 200 ml of water and once with 200 ml of saturated sodium chloride solution, dried over magnesium sulfate and evaporated to dryness in vacuo in a rotary evaporator. The grey residue is recrystallised from hexane. The deposited crystals are filtered off with suction, washed with a little MeOH and dried in vacuo; yield: 23 g, 80% of theory; purity: 99.2% according to HPLC.

b) Preparation of 3',2''-diamino-p-quaterphenyl

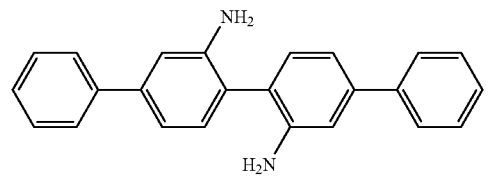

16.6 g (42 mmol) of 3',2''-dinitro-p-quaterphenyl and 1.99 g of Pd/C (10%) are suspended in 200 ml of methanol, and 8.4 g (222 mmol) of sodium borohydride are added in portions with stirring at 0° C. After stirring for 2 hours, the clear solution is neutralised with dilute HCl. The solvent is then removed, and the residue is washed intensively with water and recrystallised from dioxane. The precipitate is filtered and dried in vacuo, giving 11 g (35.6 mmol) of a crystalline solid. The overall yield is 78%.

Example 2

General Synthetic Procedure for Metal Complexes

There are two general methods for the preparation of the complexes:
A) Reaction of aromatic amines with metal salts and o-hydroxyaldehyde or o-hydroxyketone;

B) Reaction of Schiff bases of the aromatic amines with metal salts.

Method A can be used if the by-product ($H_2O$) does not destroy the complex to be prepared. If this complex is moisture-sensitive or if the imine formation is not quantitative, method B is suitable.

Method A: General synthetic procedure

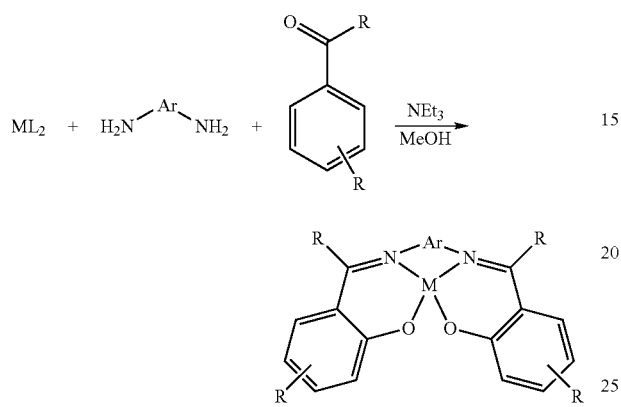

260 mmol of the o-hydroxyaldehyde or o-hydroxyketone are added to a solution of 121 mmol of aromatic diamine in 1000 ml of dry methanol and 100 ml of triethylamine. 127 mmol of metal salt, for example zinc acetate, are subsequently added to the mixture, which is stirred at room temperature for 24 hours, then filtered and washed with cold methanol. The product is purified by recrystallisation.

Method B: General synthetic procedure

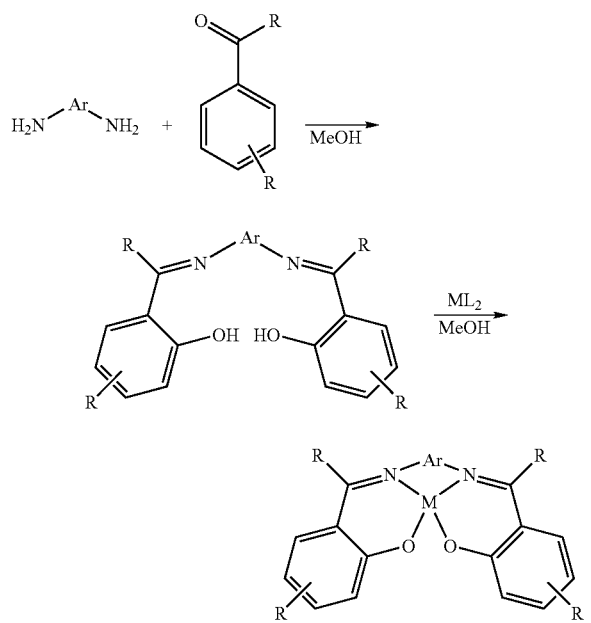

i) Ligand Synthesis

The ligand synthesis is carried out using azeotropic distillation for removing the water formed. 300 ml of dry toluene are heated to the boil in a distillation apparatus with three-necked flask, stirrer, internal thermometer and dropping funnel. A solution of 60 mmol of the aromatic amine in 50 ml of dry toluene and a solution of 120 mmol of the aldehyde or ketone in 50 ml of toluene are subsequently slowly added dropwise. A catalytic amount of p-toluenesulfonic acid is added to the mixture. The distillation is carried out until the clear, condensed toluene appears. The residues of the solvent are removed in an oil-pump vacuum (130 Pa). The azomethines are isolated as yellow solids, recrystallised from toluene and washed with MeOH.

ii) Complex Synthesis

A solution of the corresponding imine ligand (17 mmol) in 100 ml of methanol is added to a solution of 19 mmol of a suitable metal salt, for example 3.4 g of zinc acetate dihydrate, in 100 ml of methanol, and the mixture is stirred at room temperature for 3 days. After filtration, the solid is dried in vacuo and subsequently recrystallised under a protective gas.

Example 3

Synthesis of Zn Complex (1)

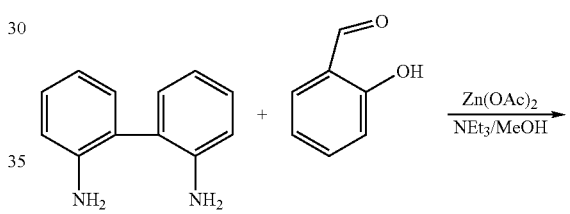

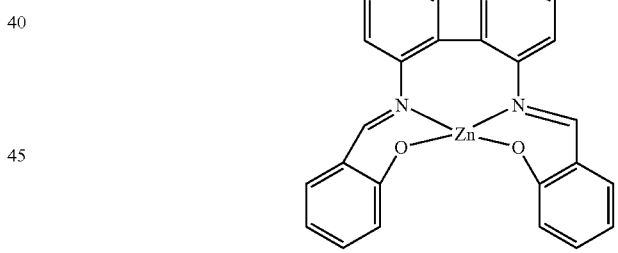

The synthesis of [[2,2'-[[1,1'-biphenyl]-2,2'-diylbis(nitrilomethylidyne)]bis[phenolato]](2-)—N,N',O,O']zinc was described for the first time by method (B) in *Journal of the Chemical Society, Dalton Transactions: Inorganic Chemistry* 1996, 2835-2838. The complex obtained by this method contains the free ligand as by-product, which makes preparation of the complex in a purity >99% more difficult. Method (A) described above, starting from 8.9 g (48 mmol) of 2,2'-diaminobiphenyl, 17 g (140 mmol) of 2-hydroxybenzaldehyde, 8.8 g (48 mmol) of zinc acetate dihydrate and 40 ml of triethylamine in 400 ml of absolute MeOH, gives the complex in a very high yield and in a purity of >99.9%. After 24 hours, the precipitated solid is washed with cold methanol, dried in vacuo and subsequently recrystallised from absolute EtOH under a protective gas, giving 21.5 g (47 mmol) of a crystalline solid. The overall yield is 98% ($T_g$=152.0° C., $T_m$=280.0° C.).

Example 4

Synthesis of Zn Complex (22)

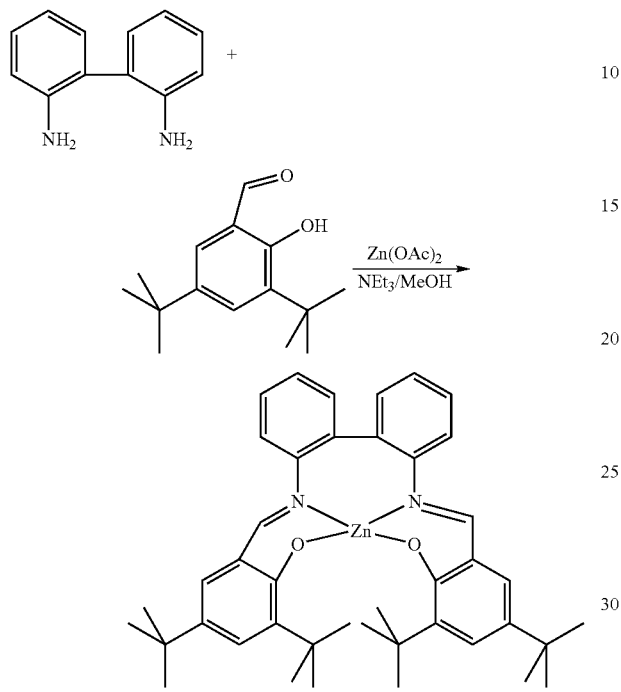

This complex is synthesised by method (A) starting from 8.9 g (48 mmol) of 2,2'-diaminobiphenyl, 24.3 g (140 mmol) of 3,4-di-tert-butyl-2-hydroxybenzaldehyde, 8.8 g (48 mmol) of zinc acetate dihydrate and 40 ml of triethylamine in 400 ml of absolute MeOH. After 24 hours, the precipitated solid is washed with cold methanol, dried in vacuo and subsequently recrystallised from absolute EtOH under a protective gas, giving 29 g (42 mmol) of a crystalline solid. The overall yield is 96% ($T_g$=170.5° C., $T_m$=314.2° C.).

Example 5

Synthesis of Zn Complex (16)

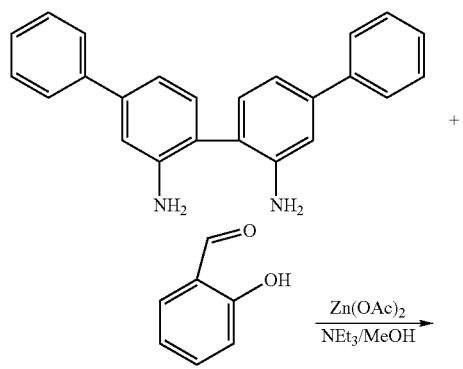

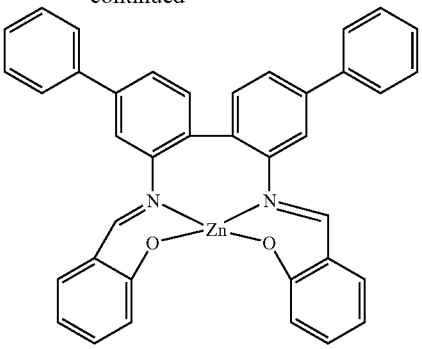

This complex is synthesised by method (A) starting from 16 g (48 mmol) of 3',2''-diamino-p-quaterphenyl, 24.3 g (140 mmol) of 2-hydroxybenzaldehyde, 8.8 g (48 mmol) of zinc acetate dihydrate and 40 ml of triethylamine in 400 ml of absolute MeOH. After 24 hours, the precipitated solid is washed with cold methanol, dried in vacuo and subsequently recrystallised from absolute EtOH under a protective gas, giving 27 g (44 mmol) of a crystalline solid. The overall yield is 96% ($T_g$=252.7° C., $T_m$=367.6° C.).

Example 6

Synthesis of Zn Complex (2)

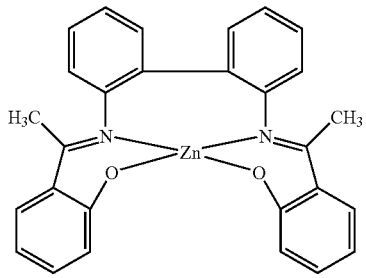

This complex is synthesised by method (B).

a) Ligand Synthesis

The synthesis is carried out from 11.16 g (60.59 mmol) of 2,2'-diaminobiphenyl, 16.3 g (120 mmol) of 2-hydroxyacetophenone and 0.2 g (1.1 mmol) of p-toluenesulfonic acid in 400 ml of toluene. After 24 hours, the precipitated solid is washed with cold methanol, giving 20 g (47 mmol) of a crystalline solid. The overall yield is 76%.

b) Complex Synthesis

The synthesis is carried out from 3.4 g (19 mmol) of zinc acetate dihydrate and 6 g (17 mmol) of ligand in 200 ml of methanol. After 24 hours, the precipitated solid is washed with cold methanol, dried in vacuo and subsequently recrystallised from absolute EtOH under a protective gas, giving 6 g (13.1 mmol) of a crystalline solid. The overall yield is 86% ($T_g$=143.4° C., $T_m$=261.0° C.).

Example 7

Synthesis of Zn Complex (15)

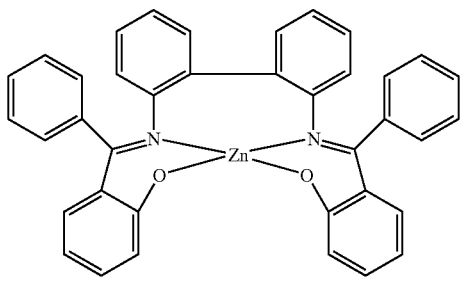

This complex is synthesised by method (B).

a) Ligand Synthesis

The synthesis is carried out from 11.16 g (60.59 mmol) of 2,2'-diaminobiphenyl, 23 g (120 mmol) of 2-hydroxybenzophenone and 0.2 g (1.1 mmol) of p-toluenesulfonic acid in 400 ml of toluene. After 24 hours, the precipitated solid is washed with cold methanol, giving 22.5 g (41 mmol) of a crystalline solid. The overall yield is 70%.

b) Complex Synthesis

The synthesis is carried out from 3.4 g (19 mmol) of zinc acetate dihydrate and 9.2 g (17 mmol) of ligand in 200 ml of methanol. After 24 hours, the precipitated solid is washed with cold methanol, dried in vacuo and subsequently recrystallised from absolute EtOH under a protective gas, giving 7.5 g (11 mmol) of a crystalline solid. The overall yield is 73% ($T_g$=232.8° C., $T_m$=354.5° C.).

Example 8

Synthesis of Zn Complex (134)

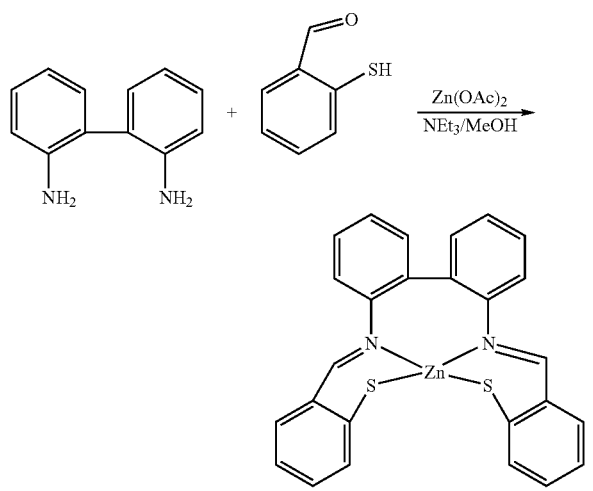

This complex is synthesised by method (A) starting from 8.9 g (48 mmol) of 2,2'-diaminobiphenyl, 19.3 g (140 mmol) of 2-mercaptobenzaldehyde, 8.8 g (48 mmol) of zinc acetate dihydrate and 40 ml of triethylamine in 400 ml of absolute MeOH. After 24 hours, the precipitated solid is washed with cold methanol, dried in vacuo and subsequently recrystallised from absolute EtOH under a protective gas, giving 22 g (45 mmol) of a crystalline solid. The overall yield is 94% ($T_g$=165.5° C., $T_m$=290.0° C.).

Examples 9 to 11

Production and Characterisation of Organic Electroluminescent Devices Containing Compounds of the Formula (I)

Electroluminescent devices according to the invention can be produced as described, for example, in WO 05/003253. The results for various OLEDs are compared here. The basic structure, the materials used, the degree of doping and the layer thicknesses thereof are identical for better comparability. Only the host in the emission layer is varied. The first device example describes a comparative standard in accordance with the prior art, in which the emission layer consists of the host material B-Alq and the guest material (dopant) Ir(piq)$_3$. Furthermore, an OLED having an emitter layer consisting of the host material Zn complex (1) and the guest material (dopant) Ir(piq)$_3$ is described. OLEDs having the following structure are produced analogously to the general process mentioned above:

Hole-injection layer (HIL) 10 nm of 2,2',7,7'-tetrakis(di-para-tolylamino)spiro-9,9'-bifluorene Hole-transport layer (HTL) 30 nm of NPB (N-naphthyl-N-phenyl-4,4'-diaminobiphenyl)

Emission layer (EML) host: B-Alq (vapour-deposited; from E-Ray and purified further, sublimed twice; bis(2-methyl-8-quinolinolato-N1,O8)-(1,1'-biphenyl-4-olato)aluminium or CBP (bis(carbazol-9-yl)biphenyl) as comparison or Zn complex (1).

Dopant: Ir(piq)$_3$ (10% doping, vapour-deposited; synthesised in accordance with WO 03/0068526).

Electron conductor (ETL) 20 nm of AlQ$_3$ (purchased from E-Ray, tris(quinolinato)aluminium(III))

Cathode 1 nm of LiF, 150 nm of Al on top.

The structure of Ir(piq)$_3$ is shown below for clarity:

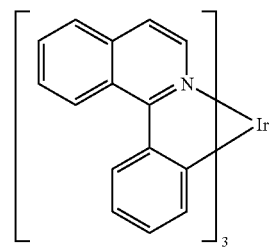

These as yet unoptimised OLEDs are characterised by standard methods; for this purpose, the electroluminescence spectra, the efficiency (measured in cd/A) as a function of the luminance, calculated from the current/voltage/luminance characteristic lines (IUL characteristic lines), and the lifetime are determined.

With OLEDs produced with the host CBP as comparative experiment, a maximum efficiency of about 6.5 cd/A with colour coordinates of CIE: x=0.68, y=0.32 is typically obtained under the conditions described above. For the reference luminous density of 1000 cd/m$^2$, voltages of 6.8 V are required. The lifetime is about 6000 hours at an initial luminous density of 1000 cd/m$^2$ (see Table 1).

With OLEDs produced with the host B-Alq as further comparative experiment, a maximum efficiency of about 8.0 cd/A with colour coordinates of CIE: x=0.68, y=0.32 is typically obtained under the conditions described above. For the reference luminous density of 1000 cd/m², voltages of 7.5 V are required. The lifetime is about 7000 hours at an initial luminous density of 1000 cd/m² (see Table 1).

By contrast, OLEDs according to the invention produced with the host Zn complex (1) exhibit maximum efficiencies of 8.5 cd/A with colour coordinates of CIE: x=0.68, y=0.32 with an otherwise identical structure, where the requisite voltage for the reference luminous density of 1000 cd/m² is 5.0 V (see Table 1). The lifetime at an initial luminous density of 1000 cd/m² is, at 9000 hours, significantly longer and the voltage, at 5.0 V, is significantly lower than in the case of the reference materials CBP and B-Alq (see Table 1).

TABLE 1

Device results with various host materials and with Ir(piq)₃ as dopant

| Experiment | EML | Max. efficiency [cd/A] | Voltage [V] at 1000 cd/m² | CIE (x, y) | Lifetime [h] initial luminance 1000 [cd/m²] |
|---|---|---|---|---|---|
| Example 9 (comparison) | CBP: 10% of Ir(piq)₃ (40 nm) | 6.5 | 6.8 | 0.68/0.32 | 6000 |
| Example 10 (comparison) | BAlq: 10% of Ir(piq)₃ (40 nm) | 8.0 | 7.5 | 0.68/0.32 | 7000 |
| Example 11 | Zn complex (1): 10% of Ir(piq)₃ (40 nm) | 8.5 | 5.0 | 0.68/0.32 | 9000 |

The invention claimed is:

1. An organic electroluminescent device comprising, in the emitting layer, at least one phosphorescent compound and at least one compound of formula (I)

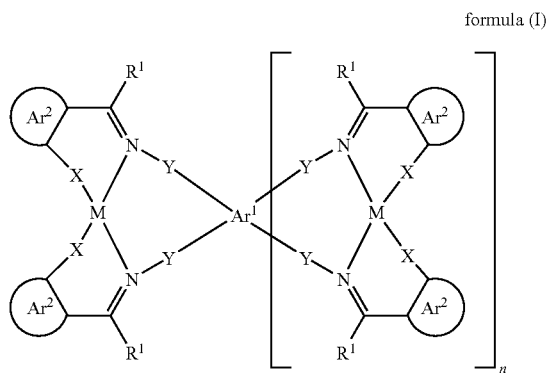

formula (I)

wherein

M is on each occurrence, identically or differently, a metal ion in the oxidation state +II, selected from Be, Mg, Ca, Sr, Ba, Fe, Ru, Os, Co, Cu, Zn, Cd, Hg, Sn and Pb;

X is on each occurrence, identically or differently, O, S or CO—O;

Ar¹ is an aromatic or heteroaromatic ring system having 5 to 60 aromatic ring atoms, which may be substituted by one or more radicals R and in which individual aromatic groups may be linked to one another via alkylene groups having 1 to 10 C atoms, in which, in addition, one or more non-adjacent C atoms is optionally replaced by O or S;

Ar² is on each occurrence, identically or differently, an aromatic or heteroaromatic ring system having 5 to 60 aromatic ring atoms, which is optionally substituted by one or more radicals R;

Y is on each occurrence, identically or differently, a single bond or an alkylene group having 1 to 10 C atoms, in which, in addition, one or more non-adjacent C atoms which are not bonded to the nitrogen is optionally replaced by O and which is optionally substituted by one or more radicals R;

R is on each occurrence, identically or differently, H, F, Cl, Br, I, N(R²)₂, CN, NO₂, Si(R²)₃, B(OR²)₂, C(=O)R², P(=O)(R²)₂, S(=O)R², S(=O)₂R², OSO₂R², a straight-chain alkyl, alkoxy or thioalkyl group having 1 to 40 C atoms or a branched or cyclic alkyl, alkoxy or thioalkyl group having 3 to 40 C atoms, each of which is optionally substituted by one or more radicals R², where one or more non-adjacent CH₂ groups is optionally replaced by R²C=CR², C≡C, Si(R²)₂, Ge(R²)₂, Sn(R²)₂, C=O, C=S, C=Se, C=NR², P(=O)(R²), SO, SO₂, NR², O, S or CONR² and where one or more H atoms is optionally replaced by F, Cl, Br, I, CN or NO₂, or an aromatic or heteroaromatic ring system having 5 to 60 aromatic ring atoms, each of which is optionally substituted by one or more radicals R², or an aryloxy or heteroaryloxy group having 5 to 60 aromatic ring atoms, which is optionally substituted by one or more radicals R², or a combination of these systems; two or more substituents R here optionally forms a mono- or polycyclic aliphatic or aromatic ring system with one another;

R¹ is on each occurrence, identically or differently, H, F, CF₃, a straight-chain alkyl group having 1 to 40 C atoms or a branched or cyclic alkyl group having 3 to 40 C atoms, each of which is optionally substituted by one or more radicals R², where one or more non-adjacent CH₂ groups is optionally replaced by R²C=CR², C≡C, Si(R²)₂, Ge(R²)₂, Sn(R²)₂ and where one or more H atoms is optionally replaced by F, Cl, Br, I, CN or NO₂, or an aromatic or heteroaromatic ring system having 5 to 60 aromatic ring atoms, each of which is optionally substituted by one or more radicals R², or a combination of these systems; R¹ here optionally forms a mono- or polycyclic aliphatic or aromatic ring system with one or more substituents R;

R² is on each occurrence, identically or differently, H, F or an aliphatic, aromatic or heteroaromatic hydrocarbon radical having 1 to 20 C atoms, in which, in addition, one or more H atoms is optionally replaced by F; two or more substituents R² here optionally forms a mono- or polycyclic aliphatic or aromatic ring system with one another;

n is on each occurrence, identically or differently, 0, 1 or 2.

2. The organic electroluminescent device according to claim 1, wherein Y is identically or differently on each occurrence, stands for a single bond or for a C(R)₂ group.

3. The organic electroluminescent device according to claim 1, wherein the group Y—Ar¹-y, for n=0, stands for a group of the formulae (II) to (XV), where the dashed bond indicates the link to the imine nitrogen:

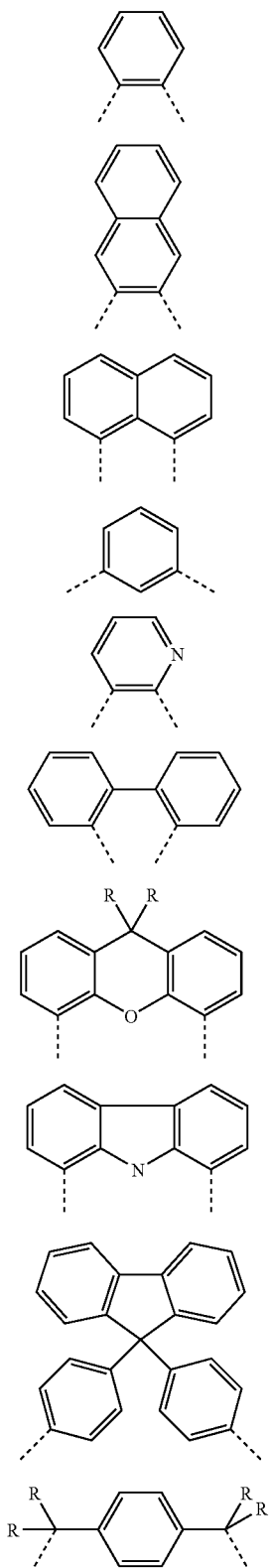

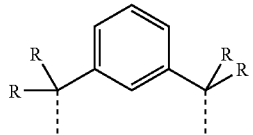

(XII)

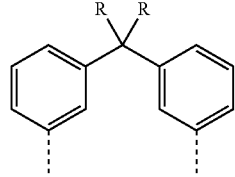

(XIII)

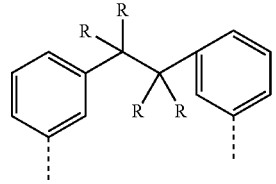

(XIV)

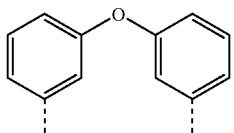

(XV)

4. The organic electroluminescent device according to claim 1, wherein Ar¹, for n=1, stands for a group of the formulae (XVI) to (XXI), where the dashed bond indicates the link to the imine nitrogen:

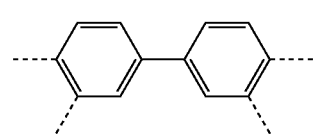

(XVI)

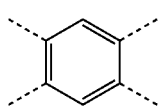

(XVII)

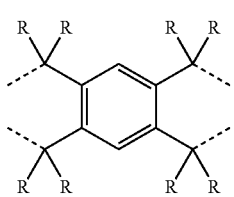

(XVIII)

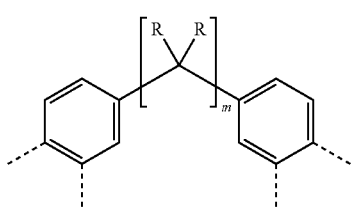

(XIX)

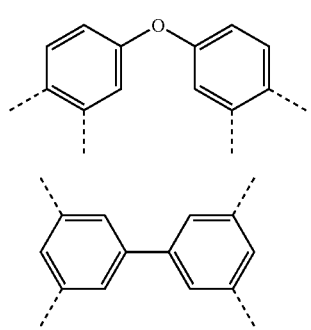

(XX)

(XXI)

5. The organic electroluminescent device according to claim 1, wherein Ar² is identically or differently on each occurrence, stands for an aryl or heteroaryl group having 5 to 16 aromatic ring atoms, which is optionally substituted by one or more radicals R.

6. The organic electroluminescent device according to claim 1, wherein Ar² is identically or differently on each occurrence, stands for an aryl or heteroaryl group having 5 to 16 aromatic ring atoms, which is optionally substituted by one or more radicals R, selected from phenyl, 1- or 2-naphthyl, 4-biphenyl, 1- or 2-anthryl, 2- or 3-thienyl, 2- or 3-pyrrolyl, 2- or 3-furanyl, 2-, 3- or 4-pyridinyl, 3- or 4-pyridazinyl, 4- or 5-pyrimidinyl, pyrazinyl, 2-, 3-, 4-, 5-, 6-, 7- or 8-quinolinyl or 3-, 4-, 5-, 6-, 7- or 8-isoquinolinyl, each of which is optionally substituted by one or more radicals R.

7. The organic electroluminescent device according to claim 1, wherein R is identically or differently on each occurrence, stands for F, $N(R^2)_2$, $Si(R^2)_3$, $C(=O)R^2$, $P(=O)(R^2)_2$, a straight-chain alkyl group having 1 to 10 C atoms or a branched or cyclic alkyl group having 3 to 10 C atoms, each of which is optionally substituted by one or more radicals $R^2$, where one or more non-adjacent $CH_2$ groups is optionally replaced by $R^2C=CR^2$, O or S and one or more H atoms is optionally replaced by F, or an aryl or heteroaryl group having 5 to 16 aromatic ring atoms, each of which is optionally substituted by one or more radicals $R^2$, or a combination of these systems; two or more substituents R here optionally form a mono- or polycyclic aliphatic or aromatic ring system with one another.

8. The organic electroluminescent device according to claim 1, wherein $R^1$ is identically or differently on each occurrence, stands for H, a straight-chain alkyl group having 1 to 6 C atoms or a branched or cyclic alkyl group having 3 to 6 C atoms, where in each case one or more H atoms is optionally replaced by F, or for an aryl or heteroaryl group having 5 to 16 aromatic ring atoms, each of which is optionally substituted by one or more radicals $R^2$.

9. The organic electroluminescent device according to claim 1, wherein the compounds of the formula (I) are in the form of simple complexes or in dimeric or oligomeric form in the solid state.

10. The organic electroluminescent device according to claim 1, wherein, in the compounds of the formula (I), all symbols Ar² are identical, all symbols X are identical, all symbols $R^1$ are identical, all symbols Y are identical and the compounds are identically substituted.

11. The organic electroluminescent device according to claim 1, wherein the organic electroluminescent device comprises cathode, anode and at least one emitting layer and optionally comprises further layers selected from hole-injection layers, hole-transport layers, electron-blocking layers, hole-blocking layers, electron-transport layers, electron-injection layers, charge-generation layers and organic or inorganic p/n junctions.

12. The organic electroluminescent device according to claim 1, wherein the organic electroluminescent device comprises a plurality of emitting layers, where at least one layer comprises at least one compound of the formula (I) and at least one phosphorescent compound.

13. The organic electroluminescent device according to claim 1, wherein the phosphorescent compound contains copper, molybdenum, tungsten, rhenium, ruthenium, osmium, rhodium, iridium, palladium, platinum, silver, gold or europium.

14. The organic electroluminescent device according to claim 12, wherein the phosphorescent compound comprises at least one compound of the formulae (XXII) to (XXV)

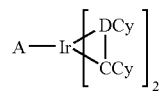

(XXII)

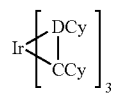

(XXIII)

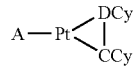

(XXIV)

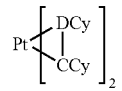

(XXV)

wherein

R is on each occurrence, identically or differently, H, F, Cl, Br, I, $N(R^2)_2$, CN, $NO_2$, $Si(R^2)_3$, $B(OR^2)_2$, $C(=O)R^2$, $P(=O)(R^2)_2$, $S(=O)R^2$, $S(=O)_2R^2$, $OSO_2R^2$, a straight-chain alkyl, alkoxy or thioalkyl group having 1 to 40 C atoms or a branched or cyclic alkyl, alkoxy or thioalkyl group having 3 to 40 C atoms, each of which is optionally substituted by one or more radicals $R^2$, where one or more non-adjacent $CH_2$ groups is optionally replaced by $R^2C=CR^2$, $C≡C$, $Si(R^2)_2$, $Ge(R^2)_2$, $Sn(R^2)_2$, C=O, C=S, C=Se, $C=NR^2$, $P(=O)(R^2)$, SO, $SO_2$, $NR^2$, O, S or $CONR^2$ and where one or more H atoms is optionally replaced by F, Cl, Br, I, CN or $NO_2$, or an aromatic or heteroaromatic ring system having 5 to 60 aromatic ring atoms, each of which is optionally substituted by one or more radicals $R^2$, or an aryloxy or heteroaryloxy group having 5 to 60 aromatic ring atoms, which is optionally substituted by one or more radicals $R^2$, or a combination of these systems; two or more substituents R here optionally form a mono- or polycyclic aliphatic or aromatic ring system with one another;

$R^2$ is on each occurrence, identically or differently, H, F or an aliphatic, aromatic or heteroaromatic hydrocarbon radical having 1 to 20 C atoms, in which, in addition, one or more H atoms is optionally replaced by F; two or more substituents $R^2$ here optionally forms a mono- or polycyclic aliphatic or aromatic ring system with one another;

DCy is, identically or differently on each occurrence, a cyclic group which contains at least one donor atom, via which the cyclic group is bonded to the metal, and which optionally carries one or more substituents R; the groups DCy and CCy are connected to one another via a covalent bond;

CCy is, identically or differently on each occurrence, a cyclic group which contains a carbon atom via which the cyclic group is bonded to the metal and which may in turn carry one or more substituents R;

A is, identically or differently on each occurrence, a monoanionic, bidentate chelating ligand.

15. The organic electroluminescent device according to claim 12, wherein DCy is, identically or differently on each occurrence, a cyclic group which contains nitrogen or phosphorus, via which the cyclic group is bonded to the metal, and which optionally carries one or more substituents R; the groups DCy and CCy are connected to one another via a covalent bond; and A is, identically or differently on each occurrence, a diketonate ligand.

16. A process for the production of an organic electroluminescent device according to claim 1, which comprises applying one or more layers by means of a sublimation process or by means of the OVPD (organic vapour phase deposition) process or by means of the OVJP (organic vapour jet printing) process or with the aid of carrier-gas sublimation or are produced from solution, by spin coating or by means of a printing process.

17. A matrix material for phosphorescent compounds in organic electroluminescent devices which comprises a compound of the formula (I) according to claim 1.

* * * * *